US008188884B2

(12) United States Patent
Randall et al.

(10) Patent No.: US 8,188,884 B2
(45) Date of Patent: May 29, 2012

(54) FORWARD THROW ANTENNA UTILITY METER

(75) Inventors: Bruce E. Randall, Rock Hill, SC (US); William Medford Buchanan, Brandon, MS (US); Robert Bryan Seal, Meridian, MS (US)

(73) Assignee: SmartSynch, Inc., Jackson, MI (US)

( * ) Notice: Subject to any disclaimer, the term of this patent is extended or adjusted under 35 U.S.C. 154(b) by 1024 days.

(21) Appl. No.: 11/935,089

(22) Filed: Nov. 5, 2007

(65) Prior Publication Data

US 2008/0129536 A1 Jun. 5, 2008

Related U.S. Application Data

(60) Provisional application No. 60/864,201, filed on Nov. 3, 2006.

(51) Int. Cl.
*G08B 23/00* (2006.01)
*G08C 15/06* (2006.01)
*G01R 15/00* (2006.01)

(52) U.S. Cl. .................................... 340/870.02; 702/57

(58) Field of Classification Search ............. 340/870.02, 340/870.07, 870.28, 313; 702/45, 57, 60
See application file for complete search history.

(56) References Cited

U.S. PATENT DOCUMENTS 5,621,419 A * 4/1997 Meek et al. .................. 343/770
6,115,677 A * 9/2000 Perthold et al. ................ 702/62
6,462,713 B2 10/2002 Porter et al.
6,903,699 B2 6/2005 Porter et al.
7,453,373 B2 * 11/2008 Cumeralto et al. ...... 340/870.02
2006/0238426 A1 * 10/2006 Savage et al. ................ 343/702
2006/0284784 A1 * 12/2006 Smith et al. .................. 343/872

OTHER PUBLICATIONS

Norman Smith, et al., "Under Glass Mounted Automated Meter Reader Antenna Considerations", WP Wireless, 2006, pp. 1-21; including one page Author Biographies.

* cited by examiner

*Primary Examiner* — Brian Zimmerman
*Assistant Examiner* — Jerold Murphy
(74) *Attorney, Agent, or Firm* — Morris, Manning & Martin, LLP; John R. Harris

(57) ABSTRACT

Systems and methods are provided for a utility meter assembly comprising: a plurality of meter components configured for measuring and collecting data, wherein the meter components include a transceiver operative for signal communications over a network; a faceplate, configured such that meter reading information is displayed on the front of the faceplate; an exterior cover configured to enclose the meter components and the faceplate, wherein the faceplate is forward of the plurality of meter components; and an internal dipole antenna situated within the exterior cover, wherein the internal dipole antenna is beyond the front of the faceplate and toward the front of the utility meter assembly. The internal dipole antenna is typically situated away from the meter components, so as to minimize interference by the meter components. The internal dipole antenna is typically tuned for optimal matching impedance in an 850 MHz or 1900 MHz receiving band, so that the desired receiving band Standing Wave Ration (SWR) is achieved, and also a specified minimum radiated power threshold is maintained.

31 Claims, 26 Drawing Sheets

MARKERS:

| MKR # | FREQ GHZ | SWR UNITS |
|---|---|---|
| 1 | 0.824000000 | 4.759E+00 |
| 2 | 0.848000000 | 2.819E+00 |
| 3 | 0.869000000 | 1.193E+00 |
| 4 | 0.893000000 | 1.951E+00 |
| 5 | 1.850000000 | 4.145E+00 |
| 6 | 1.910000000 | 2.325E+00 |
| 7 | 1.931000000 | 2.118E+00 |
| 8 | 1.991000000 | 2.589E+00 |

500

| Phi Angle (°) | 0 | 30 | 60 | 90 | 120 | 150 | 180 | 210 | 240 | 270 | 300 | 330 | 360 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 109.00 | 107.36 | 101.76 | 86.62 | 104.06 | 108.13 | 109.00 | 107.36 | 101.76 | 86.62 | 104.06 | 108.13 | 109.00 |
| 30 | 107.00 | 104.00 | 100.50 | 83.50 | 97.00 | 101.00 | 102.50 | 94.00 | 100.00 | 90.00 | 96.50 | 102.00 | 107.00 |
| 60 | 94.00 | 92.00 | 89.00 | 74.00 | 89.00 | 91.50 | 90.00 | 93.00 | 94.00 | 85.00 | 91.00 | 95.50 | 94.00 |
| 90 | 77.00 | 67.50 | 68.50 | 88.00 | 89.50 | 88.00 | 85.50 | 77.50 | 76.50 | 81.00 | 86.00 | 88.50 | 77.00 |
| 120 | 87.50 | 85.00 | 85.50 | 86.50 | 79.00 | 78.00 | 86.50 | 88.00 | 81.00 | 72.50 | 79.00 | 87.00 | 87.50 |
| 150 | 93.00 | 87.00 | 84.50 | 75.00 | 80.50 | 88.50 | 89.00 | 93.50 | 92.50 | 86.50 | 76.50 | 89.50 | 93.00 |
| 180 | 75.00 | 74.39 | 83.35 | 86.12 | 86.16 | 83.51 | 75.00 | 74.39 | 83.35 | 86.12 | 86.16 | 83.51 | 75.00 |

FIG. 5A

500

| Phi Angle (°) | 0 | 30 | 60 | 90 | 120 | 150 | 180 | 210 | 240 | 270 | 300 | 330 | 360 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 86.62 | 104.06 | 108.13 | 109.00 | 107.36 | 101.76 | 86.62 | 104.06 | 108.13 | 109.00 | 107.36 | 101.76 | 86.62 |
| 30 | 79.62 | 99.62 | 105.12 | 105.62 | 104.62 | 100.62 | 93.12 | 93.12 | 102.12 | 105.12 | 104.12 | 100.12 | 79.62 |
| 60 | 83.12 | 93.62 | 97.12 | 102.12 | 101.12 | 96.62 | 87.12 | 89.12 | 92.12 | 103.62 | 93.12 | 92.62 | 83.12 |
| 90 | 76.12 | 89.62 | 95.62 | 99.12 | 99.12 | 91.12 | 85.62 | 88.12 | 97.62 | 101.62 | 101.62 | 96.62 | 76.12 |
| 120 | 87.12 | 80.62 | 88.12 | 91.12 | 89.12 | 86.12 | 87.12 | 89.12 | 94.62 | 96.12 | 95.62 | 92.12 | 87.12 |
| 150 | 87.12 | 83.62 | 88.12 | 91.62 | 87.62 | 91.12 | 84.12 | 84.12 | 82.62 | 86.12 | 89.12 | 86.62 | 87.12 |
| 180 | 86.12 | 86.16 | 83.51 | 75.00 | 74.39 | 83.35 | 86.12 | 86.16 | 83.51 | 75.00 | 74.39 | 83.35 | 86.12 |

FIG. 5B

605

$$TIS \cong \frac{2NM}{\pi \sum_{i=1}^{N-1} \sum_{j=0}^{M-1} \left[ \frac{1}{EIS_{\theta}(\theta_i, \phi_j)} + \frac{1}{EIS_{\phi}(\theta_i, \phi_j)} \right] \sin(\theta_i)}$$

FIG. 6

800

| Phi Angle (°) | 0 | 15 | 30 | 45 | 60 | 75 | 90 | 105 | 120 | 135 | 150 | 165 | 180 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 30.58 | 29.80 | 28.27 | 25.64 | 20.89 | 7.05 | 16.55 | 23.66 | 27.13 | 29.14 | 30.27 | 30.73 | 30.58 |
| 15 | 29.85 | 29.76 | 29.27 | 28.10 | 25.83 | 19.83 | 12.21 | 14.95 | 24.84 | 26.79 | 29.55 | 29.83 | 30.70 |
| 30 | 27.74 | 27.65 | 27.22 | 26.56 | 23.17 | 17.83 | 10.65 | 14.86 | 23.27 | 26.10 | 27.65 | 27.64 | 28.10 |
| 45 | 24.56 | 24.60 | 23.75 | 22.64 | 22.28 | 16.63 | 6.37 | 13.52 | 20.87 | 23.02 | 24.11 | 24.24 | 24.20 |
| 60 | 18.67 | 18.35 | 16.48 | 18.11 | 14.27 | 14.51 | 10.49 | 16.18 | 19.59 | 21.18 | 21.63 | 20.98 | 19.85 |
| 75 | -8.85 | 7.04 | 12.26 | 13.02 | 7.58 | 6.24 | 13.51 | 16.50 | 17.35 | 17.40 | 16.83 | 16.30 | 13.56 |
| 90 | 14.80 | 16.24 | 15.77 | 15.12 | 11.24 | 12.16 | 14.16 | 13.26 | 11.73 | 9.21 | -2.78 | 3.82 | 2.44 |
| 105 | 14.09 | 12.76 | 8.06 | 8.20 | 6.63 | 10.06 | 12.58 | 11.22 | 12.28 | 11.57 | 13.37 | 14.45 | 16.35 |
| 120 | 15.00 | 8.36 | 7.41 | 7.10 | 4.99 | -3.76 | 4.66 | 9.85 | 13.06 | 13.55 | 15.97 | 17.30 | 18.48 |
| 135 | 14.83 | 13.19 | 13.38 | 11.61 | 9.05 | -0.22 | 3.40 | 8.87 | 11.20 | 13.20 | 14.58 | 17.43 | 19.12 |
| 150 | -0.27 | 3.82 | 10.67 | 11.78 | 10.67 | 9.10 | 7.78 | 8.20 | 7.40 | 9.60 | 11.70 | 14.42 | 16.28 |
| 165 | 16.63 | 16.84 | 16.83 | 16.30 | 14.31 | 12.94 | 10.76 | 10.15 | 8.22 | 7.77 | 7.41 | 6.08 | 6.35 |
| 180 | 15.54 | 14.69 | 13.07 | 10.29 | 5.17 | -12.61 | 2.68 | 9.14 | 12.40 | 14.31 | 15.36 | 15.75 | 15.54 |

FIG. 8A

800

| Phi Angle (°) | 195 | 210 | 225 | 240 | 255 | 270 | 285 | 300 | 315 | 330 | 345 | 360 |
|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 29.80 | 28.27 | 25.64 | 20.89 | 7.05 | 16.55 | 23.66 | 27.13 | 29.14 | 30.27 | 30.73 | 30.58 |
| 15 | 30.82 | 30.72 | 29.76 | 28.69 | 26.20 | 21.07 | 13.80 | 14.72 | 24.23 | 27.23 | 28.30 | 29.85 |
| 30 | 28.39 | 28.40 | 27.73 | 26.30 | 23.65 | 19.15 | 10.44 | 13.86 | 21.09 | 25.63 | 27.18 | 27.74 |
| 45 | 24.41 | 24.53 | 23.86 | 22.39 | 20.13 | 13.73 | -4.63 | 13.20 | 20.91 | 22.13 | 23.61 | 24.56 |
| 60 | 18.44 | 18.62 | 19.79 | 18.32 | 12.98 | 6.48 | 3.92 | 14.43 | 18.20 | 18.73 | 19.01 | 18.67 |
| 75 | 9.10 | 11.83 | 14.55 | 12.65 | 7.26 | 1.02 | 5.27 | 10.68 | 13.23 | 13.76 | 9.86 | -8.85 |
| 90 | 10.21 | 12.59 | 13.03 | 11.52 | 4.33 | -3.26 | 5.01 | 7.25 | 9.62 | 9.87 | 11.85 | 14.80 |
| 105 | 17.80 | 18.64 | 18.24 | 17.38 | 13.34 | 6.86 | 3.07 | 3.10 | 7.83 | 10.56 | 12.67 | 14.09 |
| 120 | 19.50 | 20.52 | 20.86 | 20.11 | 18.42 | 14.58 | 7.18 | 4.97 | 10.62 | 13.99 | 15.58 | 15.00 |
| 135 | 20.28 | 20.93 | 21.59 | 21.36 | 20.02 | 17.43 | 13.02 | 6.86 | 11.41 | 15.21 | 16.45 | 14.83 |
| 150 | 17.58 | 18.48 | 19.17 | 18.92 | 18.38 | 17.19 | 13.98 | 11.34 | 8.10 | 5.14 | 5.94 | -0.27 |
| 165 | 6.59 | 7.10 | 9.51 | 9.45 | 11.25 | 12.84 | 12.73 | 12.76 | 12.39 | 11.94 | 12.62 | 16.63 |
| 180 | 14.69 | 13.07 | 10.29 | 5.17 | -12.61 | 2.68 | 9.14 | 12.40 | 14.31 | 15.36 | 15.75 | 15.54 |

FIG. 8B

800

| Phi Angle (°) | 0 | 15 | 30 | 45 | 60 | 75 | 90 | 105 | 120 | 135 | 150 | 165 | 180 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 16.55 | 23.66 | 27.13 | 29.14 | 30.27 | 30.73 | 30.58 | 29.80 | 28.27 | 25.64 | 20.89 | 7.05 | 16.55 |
| 15 | 13.84 | 14.02 | 23.39 | 25.46 | 28.16 | 29.81 | 30.26 | 30.12 | 29.20 | 27.51 | 24.79 | 23.21 | 15.59 |
| 30 | 16.38 | 15.50 | 22.72 | 25.41 | 27.47 | 29.15 | 29.86 | 29.88 | 28.93 | 26.96 | 23.91 | 22.36 | 17.48 |
| 45 | 14.88 | 14.70 | 21.16 | 24.39 | 26.65 | 28.24 | 29.10 | 29.20 | 28.21 | 25.67 | 22.26 | 17.62 | 14.36 |
| 60 | 14.08 | 15.06 | 18.40 | 22.39 | 24.63 | 26.60 | 27.62 | 27.78 | 26.78 | 24.72 | 21.52 | 18.59 | 14.47 |
| 75 | 11.19 | 10.87 | 16.03 | 19.30 | 22.49 | 24.54 | 25.28 | 25.40 | 24.50 | 22.09 | 18.26 | 14.58 | 9.16 |
| 90 | 10.18 | 7.41 | 11.80 | 16.71 | 20.20 | 21.68 | 21.96 | 21.66 | 20.92 | 19.24 | 15.73 | 10.18 | 4.28 |
| 105 | 10.74 | 8.28 | 10.75 | 14.87 | 17.81 | 19.20 | 19.22 | 18.24 | 17.31 | 16.52 | 15.46 | 12.41 | 9.81 |
| 120 | 6.79 | 4.41 | 5.19 | 10.15 | 14.02 | 15.91 | 16.91 | 15.77 | 14.47 | 14.14 | 14.48 | 14.32 | 10.87 |
| 135 | -5.25 | 5.15 | 2.40 | -16.47 | 2.55 | 8.12 | 9.47 | 9.49 | 5.22 | 3.61 | 4.58 | 10.14 | 6.74 |
| 150 | 11.59 | 11.78 | 13.25 | 12.91 | 12.00 | 12.48 | 11.58 | 8.37 | 5.42 | 5.78 | 4.76 | 4.59 | 6.03 |
| 165 | 15.05 | 14.26 | 16.23 | 16.74 | 17.12 | 17.27 | 16.86 | 16.14 | 14.65 | 12.75 | 10.76 | 3.81 | 3.96 |
| 180 | 2.68 | 9.14 | 12.40 | 14.31 | 15.36 | 15.75 | 15.54 | 14.69 | 13.07 | 10.29 | 5.17 | -12.61 | 2.68 |

FIG. 8C

800

| Phi Angle (°) | 195 | 210 | 225 | 240 | 255 | 270 | 285 | 300 | 315 | 330 | 345 | 360 |
|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 23.66 | 27.13 | 29.14 | 30.27 | 30.73 | 30.58 | 29.80 | 28.27 | 25.64 | 20.89 | 7.05 | 16.55 |
| 15 | 7.41 | 18.72 | 22.94 | 26.42 | 28.95 | 29.94 | 29.99 | 29.93 | 28.91 | 27.30 | 23.75 | 13.84 |
| 30 | -2.88 | 16.09 | 23.78 | 26.27 | 28.32 | 29.86 | 30.16 | 29.56 | 28.47 | 26.53 | 23.78 | 16.38 |
| 45 | 8.95 | 16.27 | 22.18 | 26.17 | 27.83 | 29.27 | 29.70 | 29.14 | 27.96 | 25.73 | 22.41 | 14.88 |
| 60 | 8.95 | 14.24 | 20.09 | 24.03 | 26.86 | 28.12 | 28.37 | 28.21 | 26.73 | 24.73 | 21.46 | 14.08 |
| 75 | 3.38 | 12.04 | 18.67 | 22.81 | 25.61 | 26.61 | 26.58 | 26.37 | 25.67 | 23.85 | 20.56 | 11.19 |
| 90 | 1.79 | 10.43 | 16.89 | 21.14 | 23.62 | 24.35 | 24.27 | 23.92 | 23.27 | 21.46 | 17.85 | 10.18 |
| 105 | 5.82 | 8.21 | 13.32 | 17.83 | 20.54 | 21.30 | 20.97 | 20.53 | 19.81 | 18.02 | 14.49 | 10.74 |
| 120 | 6.37 | -8.40 | 2.65 | 11.13 | 15.04 | 16.77 | 17.51 | 18.52 | 18.45 | 17.47 | 15.74 | 6.79 |
| 135 | 6.50 | 8.39 | 9.08 | 10.53 | 11.20 | 14.01 | 16.28 | 17.91 | 17.94 | 17.22 | 15.73 | -5.25 |
| 150 | 7.48 | 7.60 | 8.45 | 8.16 | 7.92 | 9.30 | 11.84 | 12.91 | 13.93 | 13.38 | 12.09 | 11.59 |
| 165 | 1.10 | 0.86 | -1.53 | -1.05 | -0.93 | -2.92 | -3.43 | 3.48 | 5.16 | 4.84 | 4.53 | 15.05 |
| 180 | 9.14 | 12.40 | 14.31 | 15.36 | 15.75 | 15.54 | 14.69 | 13.07 | 10.29 | 5.17 | -12.61 | 2.68 |

FIG. 8D

900

$$TRP \cong \frac{\pi}{2NM} \sum_{i=1}^{N-1} \sum_{j=0}^{M-1} \left[ EiRP_{\theta}(\theta_i, \phi_j) + EiRP_{\phi}(\theta_i, \phi_j) \sin(\theta_i) \right]$$

FIG. 9

3-D TOROIDAL PATTERN
RADIATED POWER

| Phi Angle (°) | 0 | 30 | 60 | 90 | 120 | 150 | 180 | 210 | 240 | 270 | 300 | 330 | 360 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 108.77 | 106.91 | 100.77 | 90.19 | 104.36 | 108.09 | 108.77 | 106.91 | 100.77 | 90.19 | 104.36 | 108.09 | 108.77 |
| 30 | 96.77 | 107.27 | 103.77 | 91.77 | 99.27 | 104.27 | 106.27 | 106.27 | 105.27 | 96.27 | 99.27 | 106.27 | 96.77 |
| 60 | 97.27 | 99.27 | 96.77 | 88.27 | 92.27 | 95.77 | 92.27 | 98.27 | 98.77 | 90.77 | 95.27 | 100.77 | 97.27 |
| 90 | 89.77 | 87.77 | 87.27 | 89.77 | 85.77 | 84.27 | 82.77 | 58.27 | 63.27 | 83.27 | 87.27 | 90.77 | 89.77 |
| 120 | 85.27 | 84.77 | 85.77 | 81.27 | 74.27 | 79.77 | 83.27 | 86.27 | 81.27 | 80.27 | 79.77 | 85.27 | 85.27 |
| 150 | 86.77 | 83.77 | 85.77 | 79.77 | 77.77 | 85.77 | 88.27 | 88.27 | 89.27 | 85.77 | 67.27 | 85.27 | 86.77 |
| 180 | 73.77 | 61.47 | 76.82 | 80.69 | 81.45 | 79.68 | 73.77 | 61.47 | 76.82 | 80.69 | 81.45 | 79.68 | 73.77 |

FIG. 11A

| Phi Angle (°) | 0 | 30 | 60 | 90 | 120 | 150 | 180 | 210 | 240 | 270 | 300 | 330 | 360 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 90.19 | 104.36 | 108.09 | 108.77 | 106.91 | 100.77 | 90.19 | 104.36 | 108.09 | 108.77 | 106.91 | 100.77 | 90.19 |
| 30 | 92.19 | 100.69 | 106.69 | 108.69 | 107.69 | 103.69 | 95.19 | 96.69 | 106.19 | 109.69 | 109.69 | 106.19 | 92.19 |
| 60 | 91.19 | 96.69 | 103.19 | 105.69 | 104.69 | 99.19 | 92.19 | 93.69 | 104.69 | 97.19 | 108.19 | 98.19 | 91.19 |
| 90 | 87.19 | 91.69 | 97.69 | 99.19 | 95.19 | 92.69 | 86.69 | 91.19 | 90.69 | 103.19 | 103.69 | 99.19 | 87.19 |
| 120 | 87.69 | 79.69 | 88.69 | 91.19 | 90.19 | 87.69 | 85.19 | 89.19 | 95.69 | 93.69 | 97.19 | 94.69 | 87.69 |
| 150 | 84.19 | 78.19 | 83.69 | 87.69 | 88.19 | 87.69 | 85.69 | 80.69 | 82.69 | 87.19 | 89.69 | 89.19 | 84.19 |
| 180 | 80.69 | 81.45 | 79.68 | 73.77 | 61.47 | 76.82 | 80.69 | 81.45 | 79.68 | 73.77 | 61.47 | 76.82 | 80.69 |

FIG. 11B

| Phi Angle (°) | 0 | 30 | 60 | 90 | 120 | 150 | 180 | 210 | 240 | 270 | 300 | 330 | 360 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 108.29 | 106.21 | 99.48 | 92.30 | 104.38 | 107.80 | 108.29 | 106.21 | 99.48 | 92.30 | 104.38 | 107.80 | 108.29 |
| 30 | 106.29 | 94.79 | 95.79 | 87.79 | 92.29 | 97.79 | 100.29 | 100.79 | 99.29 | 90.79 | 92.29 | 99.79 | 106.29 |
| 60 | 96.79 | 98.29 | 95.29 | 86.79 | 84.79 | 90.29 | 89.29 | 91.79 | 92.29 | 86.29 | 87.29 | 94.29 | 96.79 |
| 90 | 88.79 | 90.29 | 88.79 | 91.29 | 87.29 | 85.29 | 83.79 | 81.79 | 82.79 | 85.79 | 84.79 | 88.29 | 88.79 |
| 120 | 77.29 | 82.79 | 83.79 | 76.79 | 71.79 | 64.29 | 84.29 | 85.79 | 83.29 | 81.79 | 64.29 | 81.29 | 77.29 |
| 150 | 85.79 | 68.79 | 81.79 | 79.79 | 80.79 | 84.79 | 85.79 | 88.79 | 89.29 | 87.29 | 80.29 | 86.29 | 85.79 |
| 180 | 69.29 | 78.49 | 84.85 | 86.80 | 86.19 | 82.58 | 69.29 | 78.49 | 84.85 | 86.80 | 86.19 | 82.58 | 69.29 |

FIG. 12A

| Phi Angle (°) | 0 | 30 | 60 | 90 | 120 | 150 | 180 | 210 | 240 | 270 | 300 | 330 | 360 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 92.30 | 104.38 | 107.80 | 108.29 | 106.21 | 99.48 | 92.30 | 104.38 | 107.80 | 108.29 | 106.21 | 99.48 | 92.30 |
| 30 | 89.30 | 97.30 | 102.80 | 103.30 | 101.80 | 97.30 | 90.30 | 91.30 | 100.30 | 103.30 | 103.30 | 97.30 | 89.30 |
| 60 | 86.30 | 93.30 | 99.80 | 101.30 | 99.30 | 93.80 | 85.30 | 88.80 | 97.80 | 101.80 | 101.30 | 96.80 | 86.30 |
| 90 | 80.80 | 91.30 | 96.80 | 99.30 | 98.30 | 88.80 | 84.30 | 88.30 | 96.30 | 99.80 | 94.30 | 95.30 | 80.80 |
| 120 | 87.30 | 81.30 | 85.80 | 87.30 | 88.80 | 85.80 | 82.80 | 87.30 | 92.80 | 94.30 | 94.80 | 92.30 | 87.30 |
| 150 | 84.80 | 77.30 | 81.30 | 86.80 | 87.30 | 88.80 | 87.30 | 83.30 | 78.80 | 86.30 | 88.30 | 88.80 | 84.80 |
| 180 | 86.80 | 86.19 | 82.58 | 69.29 | 78.49 | 84.85 | 86.80 | 86.19 | 82.58 | 69.29 | 78.49 | 84.85 | 86.80 |

FIG. 12B

| Phi Angle (°) | 0 | 15 | 30 | 45 | 60 | 75 | 90 | 105 | 120 | 135 | 150 | 165 | 180 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 32.08 | 31.13 | 29.37 | 26.36 | 20.64 | -7.62 | 20.64 | 26.36 | 29.37 | 31.13 | 32.08 | 32.38 | 32.08 |
| 15 | 30.93 | 31.37 | 31.17 | 29.96 | 27.24 | 24.44 | 13.63 | 12.86 | 23.08 | 29.21 | 29.98 | 30.91 | 31.83 |
| 30 | 28.37 | 28.82 | 28.95 | 27.79 | 25.99 | 22.56 | 13.10 | 14.38 | 24.94 | 27.69 | 29.08 | 29.01 | 29.29 |
| 45 | 24.89 | 25.58 | 25.46 | 24.89 | 22.16 | 18.68 | 11.62 | 16.12 | 22.28 | 23.45 | 24.82 | 24.31 | 24.61 |
| 60 | 20.54 | 20.36 | 20.31 | 19.92 | 18.92 | 15.40 | 15.00 | 17.20 | 20.47 | 21.30 | 22.53 | 19.81 | 19.03 |
| 75 | 7.03 | 5.55 | 9.68 | 11.78 | 6.58 | 12.13 | 17.15 | 18.75 | 19.84 | 20.31 | 20.16 | 18.71 | 16.65 |
| 90 | 14.88 | 16.62 | 17.45 | 15.76 | 11.42 | 14.42 | 17.90 | 18.05 | 16.74 | 15.78 | 13.86 | 12.55 | 10.22 |
| 105 | 16.35 | 16.92 | 14.74 | 13.23 | 11.78 | 15.04 | 16.41 | 16.54 | 13.85 | 13.42 | 11.97 | 10.97 | 14.50 |
| 120 | 16.32 | 12.25 | 5.67 | -2.76 | 2.65 | 7.56 | 12.65 | 14.24 | 15.00 | 15.84 | 17.21 | 17.76 | 18.26 |
| 135 | 17.69 | 14.87 | 12.88 | 10.70 | 7.74 | -3.14 | 5.76 | 11.30 | 13.49 | 15.60 | 17.45 | 19.71 | 20.35 |
| 150 | 9.85 | 5.95 | 11.23 | 10.13 | 10.90 | 7.58 | 5.06 | 8.41 | 10.15 | 12.83 | 14.56 | 17.93 | 19.80 |
| 165 | 14.19 | 15.20 | 16.57 | 16.52 | 16.08 | 14.72 | 13.55 | 11.45 | 9.33 | 9.00 | 7.50 | 11.78 | 13.41 |
| 180 | 15.02 | 13.99 | 12.10 | 8.87 | 2.52 | -14.22 | 4.67 | 9.87 | 12.67 | 14.32 | 15.18 | 15.40 | 15.02 |

FIG. 13A

| Phi Angle (°) | 195 | 210 | 225 | 240 | 255 | 270 | 285 | 300 | 315 | 330 | 345 | 360 |
|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 31.13 | 29.37 | 26.36 | 20.64 | -7.62 | 20.64 | 26.36 | 29.37 | 31.13 | 32.08 | 32.38 | 32.08 |
| 15 | 32.26 | 32.34 | 31.89 | 30.63 | 28.63 | 24.65 | 16.72 | 9.97 | 23.30 | 27.18 | 28.74 | 30.93 |
| 30 | 30.02 | 30.27 | 29.88 | 28.73 | 26.68 | 23.06 | 16.76 | 12.94 | 22.32 | 25.64 | 26.16 | 28.37 |
| 45 | 25.20 | 25.64 | 25.24 | 24.23 | 22.22 | 18.34 | 10.38 | 14.31 | 20.87 | 23.43 | 24.59 | 24.89 |
| 60 | 18.27 | 18.55 | 19.19 | 17.93 | 14.74 | 9.83 | 3.13 | 15.52 | 19.25 | 20.35 | 20.39 | 20.54 |
| 75 | 13.79 | 12.76 | 14.59 | 14.24 | 6.42 | 1.44 | 7.18 | 13.15 | 15.82 | 16.40 | 14.63 | 7.03 |
| 90 | -7.13 | 5.31 | 11.89 | 11.06 | 2.90 | -0.46 | 7.00 | 9.42 | 11.10 | 12.84 | 13.62 | 14.88 |
| 105 | 16.68 | 17.47 | 18.17 | 16.81 | 13.83 | 4.91 | -12.41 | -4.80 | 4.38 | 10.85 | 14.87 | 16.35 |
| 120 | 20.26 | 22.02 | 21.93 | 21.42 | 19.70 | 15.78 | 8.90 | -4.40 | 7.25 | 14.00 | 16.21 | 16.32 |
| 135 | 22.28 | 22.98 | 23.44 | 23.16 | 21.96 | 19.18 | 14.36 | 5.72 | 9.93 | 15.80 | 18.43 | 17.69 |
| 150 | 20.13 | 21.84 | 22.14 | 22.15 | 21.27 | 18.44 | 16.04 | 11.33 | -4.13 | 6.50 | 12.96 | 9.85 |
| 165 | 14.32 | 14.99 | 16.02 | 15.33 | 15.27 | 15.69 | 15.29 | 12.33 | 12.17 | 9.68 | 11.25 | 14.19 |
| 180 | 13.99 | 12.10 | 8.87 | 2.52 | -14.22 | 4.67 | 9.87 | 12.67 | 14.32 | 15.18 | 15.40 | 15.02 |

FIG. 13B

| Phi Angle (°) | 0 | 15 | 30 | 45 | 60 | 75 | 90 | 105 | 120 | 135 | 150 | 165 | 180 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 32.08 | 31.13 | 29.37 | 26.36 | 20.64 | -7.62 | 20.64 | 26.36 | 29.37 | 31.13 | 32.08 | 32.38 | 32.08 |
| 15 | 30.93 | 31.37 | 31.17 | 29.96 | 27.24 | 24.44 | 13.63 | 12.86 | 23.08 | 29.21 | 29.98 | 30.91 | 31.83 |
| 30 | 28.37 | 28.82 | 28.95 | 27.79 | 25.99 | 22.56 | 13.10 | 14.38 | 24.94 | 27.69 | 29.08 | 29.01 | 29.29 |
| 45 | 24.89 | 25.58 | 25.46 | 24.89 | 22.16 | 18.68 | 11.62 | 16.12 | 22.28 | 23.45 | 24.82 | 24.31 | 24.61 |
| 60 | 20.54 | 20.36 | 20.31 | 19.92 | 18.92 | 15.40 | 15.00 | 17.20 | 20.47 | 21.30 | 22.53 | 19.81 | 19.03 |
| 75 | 7.03 | 5.55 | 9.68 | 11.78 | 6.58 | 12.13 | 17.15 | 18.75 | 19.84 | 20.31 | 20.16 | 18.71 | 16.65 |
| 90 | 14.88 | 16.62 | 17.45 | 15.76 | 11.42 | 14.42 | 17.90 | 18.05 | 16.74 | 15.78 | 13.86 | 12.55 | 10.22 |
| 105 | 16.35 | 16.92 | 14.74 | 13.23 | 11.78 | 15.04 | 16.41 | 16.54 | 13.85 | 13.42 | 11.97 | 10.97 | 14.50 |
| 120 | 16.32 | 12.25 | 5.67 | -2.76 | 2.65 | 7.56 | 12.65 | 14.24 | 15.00 | 15.84 | 17.21 | 17.76 | 18.26 |
| 135 | 17.69 | 14.87 | 12.88 | 10.70 | 7.74 | -3.14 | 5.76 | 11.30 | 13.49 | 15.60 | 17.45 | 19.71 | 20.35 |
| 150 | 9.85 | 5.95 | 11.23 | 10.13 | 10.90 | 7.58 | 5.06 | 8.41 | 10.15 | 12.83 | 14.56 | 17.93 | 19.80 |
| 165 | 14.19 | 15.20 | 16.57 | 16.52 | 16.08 | 14.72 | 13.55 | 11.45 | 9.33 | 9.00 | 7.50 | 11.78 | 13.41 |

FIG. 14A

| Phi Angle (°) | 195 | 210 | 225 | 240 | 255 | 270 | 285 | 300 | 315 | 330 | 345 | 360 |
|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 31.13 | 29.37 | 26.36 | 20.64 | -7.62 | 20.64 | 26.36 | 29.37 | 31.13 | 32.08 | 32.38 | 32.08 |
| 15 | 32.26 | 32.34 | 31.89 | 30.63 | 28.63 | 24.65 | 16.72 | 9.97 | 23.30 | 27.18 | 28.74 | 30.93 |
| 30 | 30.02 | 30.27 | 29.88 | 28.73 | 26.68 | 23.06 | 16.76 | 12.94 | 22.32 | 25.64 | 26.16 | 28.37 |
| 45 | 25.20 | 25.64 | 25.24 | 24.23 | 22.22 | 18.34 | 10.38 | 14.31 | 20.87 | 23.43 | 24.59 | 24.89 |
| 60 | 18.27 | 18.55 | 19.19 | 17.93 | 14.74 | 9.83 | 3.13 | 15.52 | 19.25 | 20.35 | 20.39 | 20.54 |
| 75 | 13.79 | 12.76 | 14.59 | 14.24 | 6.42 | 1.44 | 7.18 | 13.15 | 15.82 | 16.40 | 14.63 | 7.03 |
| 90 | -7.13 | 5.31 | 11.89 | 11.06 | 2.90 | -0.46 | 7.00 | 9.42 | 11.10 | 12.84 | 13.62 | 14.88 |
| 105 | 16.68 | 17.47 | 18.17 | 16.81 | 13.83 | 4.91 | -12.41 | -4.80 | 4.38 | 10.85 | 14.87 | 16.35 |
| 120 | 20.26 | 22.02 | 21.93 | 21.42 | 19.70 | 15.78 | 8.90 | -4.40 | 7.25 | 14.00 | 16.21 | 16.32 |
| 135 | 22.28 | 22.98 | 23.44 | 23.16 | 21.96 | 19.18 | 14.36 | 5.72 | 9.93 | 15.80 | 18.43 | 17.69 |
| 150 | 20.13 | 21.84 | 22.14 | 22.15 | 21.27 | 18.44 | 16.04 | 11.33 | -4.13 | 6.50 | 12.96 | 9.85 |
| 165 | 14.32 | 14.99 | 16.02 | 15.33 | 15.27 | 15.69 | 15.29 | 12.33 | 12.17 | 9.68 | 11.25 | 14.19 |
| 180 | 13.99 | 12.10 | 8.87 | 2.52 | -14.22 | 4.67 | 9.87 | 12.67 | 14.32 | 15.18 | 15.40 | 15.02 |

FIG. 14B

| Phi Angle (°) | 0 | 15 | 30 | 45 | 60 | 75 | 90 | 105 | 120 | 135 | 150 | 165 | 180 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 35.52 | 34.63 | 32.96 | 30.09 | 24.74 | 2.96 | 23.25 | 29.40 | 32.56 | 34.40 | 35.41 | 35.77 | 35.52 |
| 15 | 34.28 | 34.51 | 34.49 | 33.05 | 31.40 | 27.95 | 20.08 | 12.84 | 27.39 | 31.06 | 31.81 | 33.81 | 34.52 |
| 30 | 30.87 | 31.82 | 31.94 | 30.69 | 29.04 | 25.96 | 15.01 | 13.33 | 26.74 | 28.01 | 30.02 | 31.31 | 31.98 |
| 45 | 26.27 | 27.19 | 27.96 | 27.47 | 26.36 | 24.14 | 13.98 | 15.86 | 21.25 | 25.21 | 26.89 | 26.49 | 26.59 |
| 60 | 22.37 | 23.49 | 23.04 | 22.41 | 21.27 | 22.49 | 18.19 | 14.52 | 17.54 | 21.24 | 21.74 | 18.42 | 16.65 |
| 75 | 16.65 | 14.71 | 12.61 | 10.51 | 14.54 | 17.29 | 20.74 | 19.59 | 22.01 | 22.84 | 22.42 | 19.31 | 15.55 |
| 90 | 14.54 | 15.35 | 17.92 | 16.54 | 9.96 | 17.10 | 20.53 | 21.11 | 20.75 | 20.39 | 19.54 | 18.52 | 16.28 |
| 105 | 19.18 | 18.72 | 17.87 | 16.24 | 15.51 | 17.73 | 20.71 | 19.87 | 18.10 | 16.10 | 11.66 | -4.72 | 8.52 |
| 120 | 19.02 | 16.79 | 4.84 | 7.55 | 11.02 | 14.33 | 16.23 | 16.57 | 16.93 | 17.55 | 17.24 | 17.09 | 18.73 |
| 135 | 20.98 | 17.87 | 13.61 | 13.66 | 12.80 | 7.94 | 6.76 | 12.33 | 15.78 | 16.14 | 19.97 | 20.34 | 21.79 |
| 150 | 18.77 | 13.70 | 8.61 | 11.93 | 12.28 | 10.78 | 4.93 | 8.47 | 13.08 | 15.56 | 18.60 | 20.32 | 20.80 |
| 165 | 6.47 | 6.68 | 15.87 | 17.36 | 16.30 | 16.07 | 15.27 | 13.31 | 12.57 | 11.36 | 14.13 | 17.20 | 18.74 |
| 180 | 13.47 | 10.83 | 6.04 | -8.08 | 1.89 | 8.93 | 12.38 | 14.38 | 15.50 | 15.95 | 15.79 | 15.01 | 13.47 |

FIG. 15A

| Phi Angle (°) | 195 | 210 | 225 | 240 | 255 | 270 | 285 | 300 | 315 | 330 | 345 | 360 |
|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 34.63 | 32.96 | 30.09 | 24.74 | 2.96 | 23.25 | 29.40 | 32.56 | 34.40 | 35.41 | 35.77 | 35.52 |
| 15 | 34.57 | 34.49 | 33.55 | 32.37 | 30.12 | 26.77 | 21.46 | 23.48 | 27.93 | 30.60 | 32.97 | 34.28 |
| 30 | 32.35 | 32.40 | 31.58 | 30.61 | 28.83 | 25.06 | 16.84 | 23.56 | 27.36 | 28.90 | 29.58 | 30.87 |
| 45 | 27.29 | 27.52 | 27.82 | 26.02 | 25.01 | 21.31 | 15.77 | 20.77 | 24.69 | 26.50 | 26.56 | 26.27 |
| 60 | 16.26 | 18.62 | 19.53 | 21.06 | 18.78 | 11.38 | 7.98 | 19.06 | 22.21 | 23.64 | 22.33 | 22.37 |
| 75 | 11.95 | 11.46 | 12.28 | 11.23 | 4.00 | 1.93 | 11.95 | 17.07 | 19.50 | 19.96 | 19.80 | 16.65 |
| 90 | 13.26 | 1.49 | 8.86 | 7.58 | 5.85 | 10.16 | 11.18 | 12.58 | 14.87 | 16.37 | 16.71 | 14.54 |
| 105 | 15.00 | 14.98 | 15.83 | 12.47 | 8.22 | -8.14 | -3.48 | 5.65 | 11.45 | 15.28 | 17.76 | 19.18 |
| 120 | 20.34 | 21.20 | 21.29 | 20.25 | 17.82 | 14.07 | 8.86 | 6.42 | 9.24 | 15.31 | 18.54 | 19.02 |
| 135 | 23.05 | 23.57 | 24.48 | 23.50 | 21.23 | 19.11 | 14.16 | 3.62 | 10.37 | 17.57 | 21.15 | 20.98 |
| 150 | 23.26 | 23.74 | 24.02 | 24.12 | 21.40 | 19.62 | 17.20 | 8.77 | 7.29 | 16.07 | 19.11 | 18.77 |
| 165 | 19.32 | 19.32 | 19.42 | 18.87 | 18.87 | 17.68 | 16.64 | 12.92 | 10.36 | 4.44 | 11.79 | 6.47 |
| 180 | 10.83 | 6.04 | -8.08 | 1.89 | 8.93 | 12.38 | 14.38 | 15.50 | 15.95 | 15.79 | 15.01 | 13.47 |

FIG. 15B

| Phi Angle (°) | 0 | 15 | 30 | 45 | 60 | 75 | 90 | 105 | 120 | 135 | 150 | 165 | 180 |
|---|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 23.25 | 29.40 | 32.56 | 34.40 | 35.41 | 35.77 | 35.52 | 34.63 | 32.96 | 30.09 | 24.74 | 2.96 | 23.25 |
| 15 | 21.20 | 15.43 | 25.63 | 29.78 | 32.65 | 33.25 | 34.03 | 34.15 | 33.86 | 32.83 | 30.82 | 28.36 | 24.48 |
| 30 | 19.20 | 12.78 | 25.29 | 29.43 | 30.94 | 33.60 | 34.34 | 33.85 | 33.33 | 32.01 | 29.94 | 27.73 | 24.59 |
| 45 | 17.72 | 12.35 | 21.15 | 26.40 | 29.80 | 32.24 | 33.27 | 33.32 | 32.22 | 30.36 | 27.77 | 24.96 | 21.45 |
| 60 | 15.79 | 14.90 | 23.52 | 26.03 | 27.49 | 29.40 | 30.94 | 31.55 | 30.79 | 28.39 | 25.29 | 22.65 | 16.74 |
| 75 | 12.91 | 11.61 | 19.18 | 23.93 | 24.80 | 27.03 | 29.40 | 29.77 | 28.83 | 26.38 | 23.18 | 18.85 | 17.12 |
| 90 | 10.84 | 5.30 | 13.64 | 19.82 | 22.93 | 24.93 | 26.11 | 26.88 | 26.20 | 24.12 | 20.80 | 16.70 | 13.44 |
| 105 | 14.79 | 6.41 | 6.92 | 15.45 | 18.13 | 21.71 | 21.44 | 21.37 | 21.13 | 19.65 | 16.68 | 12.00 | 10.01 |
| 120 | 16.07 | 11.02 | 11.53 | 13.84 | 17.10 | 19.25 | 19.36 | 18.86 | 18.21 | 18.53 | 18.49 | 16.05 | 15.98 |
| 135 | 13.90 | 12.43 | 10.89 | 11.36 | 15.19 | 17.86 | 18.52 | 19.09 | 17.96 | 18.37 | 18.41 | 18.47 | 16.93 |
| 150 | 15.14 | 15.12 | 11.17 | 4.11 | -0.61 | 10.36 | 14.47 | 15.92 | 14.76 | 14.82 | 16.68 | 16.29 | 15.10 |
| 165 | 18.78 | 17.61 | 17.73 | 14.34 | 10.81 | 4.92 | 5.24 | 11.11 | 8.49 | 11.30 | 9.88 | 11.50 | 9.11 |
| 180 | 12.38 | 14.38 | 15.50 | 15.95 | 15.79 | 15.01 | 13.47 | 10.83 | 6.04 | -8.08 | 1.89 | 8.93 | 12.38 |

FIG. 16A

| Phi Angle (°) | 195 | 210 | 225 | 240 | 255 | 270 | 285 | 300 | 315 | 330 | 345 | 360 |
|---|---|---|---|---|---|---|---|---|---|---|---|---|
| Theta Angle (°) | Power (dBm) | Power (dBm) | Power (dBm) | Power (dBm) | Power (dBm) | Power (dBm) | Power (dBm) | Power (dBm) | Power (dBm) | Power (dBm) | Power (dBm) | Power (dBm) |
| 0 | 29.40 | 32.56 | 34.40 | 35.41 | 35.77 | 35.52 | 34.63 | 32.96 | 30.09 | 24.74 | 2.96 | 23.25 |
| 15 | 15.46 | 20.93 | 26.99 | 29.93 | 32.00 | 33.48 | 33.76 | 34.15 | 32.63 | 31.05 | 28.35 | 21.20 |
| 30 | 15.45 | 19.33 | 26.11 | 29.44 | 32.34 | 33.26 | 34.32 | 33.79 | 31.62 | 29.67 | 26.26 | 19.20 |
| 45 | 13.11 | 20.64 | 25.98 | 29.38 | 31.64 | 32.77 | 33.95 | 32.69 | 30.75 | 28.29 | 24.23 | 17.72 |
| 60 | 14.39 | 20.04 | 24.86 | 27.75 | 30.08 | 31.81 | 32.85 | 31.63 | 29.36 | 25.88 | 22.93 | 15.79 |
| 75 | 16.05 | 17.48 | 22.83 | 26.12 | 28.20 | 29.80 | 30.73 | 30.83 | 29.03 | 25.22 | 22.06 | 12.91 |
| 90 | 7.63 | 13.35 | 19.67 | 24.14 | 26.22 | 27.51 | 28.91 | 28.91 | 27.02 | 24.21 | 20.55 | 10.84 |
| 105 | 12.02 | 15.38 | 19.65 | 23.03 | 24.57 | 24.78 | 25.59 | 24.71 | 23.47 | 21.37 | 16.84 | 14.79 |
| 120 | 15.85 | 16.43 | 18.52 | 20.45 | 21.46 | 20.80 | 19.11 | 17.97 | 18.37 | 17.96 | 16.71 | 16.07 |
| 135 | 13.85 | 13.73 | 11.47 | 13.03 | 13.99 | 15.42 | 16.94 | 18.70 | 19.40 | 20.86 | 18.38 | 13.90 |
| 150 | 12.93 | 7.12 | 2.56 | 0.44 | 9.83 | 14.73 | 18.04 | 19.39 | 20.14 | 19.43 | 18.11 | 15.14 |
| 165 | 3.76 | 2.37 | -2.22 | 3.88 | 5.11 | 8.57 | 12.48 | 11.77 | 15.05 | 14.95 | 13.16 | 18.78 |
| 180 | 14.38 | 15.50 | 15.95 | 15.79 | 15.01 | 13.47 | 10.83 | 6.04 | -8.08 | 1.89 | 8.93 | 12.38 |

FIG. 16B

FORWARD THROW ANTENNA UTILITY METER

CROSS-REFERENCE TO RELATED APPLICATIONS

This application claims the benefit under 35 U.S.C. §119 (e) of U.S. Provisional Patent Application Ser. No. 60/864,201, entitled "Improved Antenna Used in Electricity Metering Applications," filed Nov. 3, 2006, which is incorporated herein by reference as if set forth herein in its entirety.

TECHNICAL FIELD

The present invention relates generally to electricity meters, and more particularly, to an improved antenna design that provides improved total radiated power and total isotropic sensitivity in a communication system intended for use on a public wireless network.

BACKGROUND OF THE INVENTION

In remote meter reading systems, such as wireless metering applications, wireless utility meters are read without visual inspection or physical access to the meters. Wireless utility meters intended for use on wireless networks are required to undergo a certification process before they are granted carrier approval for network access.

Traditionally, wireless networks had certification requirements that included signaling behavior verification, which is the control protocol between the network infrastructure and the end user device. Also, network interaction was verified during both steady-state and transient conditions. However, these measurements did not characterize the over the air, radio frequency performance of communication systems. They did not convey the communication systems' sensitivity (its ability to receive low signals), that is, they did not determine how small a signal the communication systems could "hear" or receive. Further, the certification measurements did not characterize the total radiated power from the communication systems during transmission. Consequently, communication systems experienced connectivity and retransmission problems because of inadequately characterized radio frequency product performance. Unreliable connectivity, dropped calls, and data retransmission problems adversely affected the quality of service. As a result, wireless carriers shifted their focus to improving system performance and ensuring that communication systems, operating on their networks, met new over-the-air, system level requirements.

In response to increasing demand to improve wireless device performance, the United States based Cellular Telecommunications & Internet Association (CTIA) adopted more stringent, system level certification requirements that included total isotropic sensitivity (TIS) and total radiated power (TRP). The total isotropic sensitivity and total radiated power measurements reflect a system's performance in an idealized anechoic and shielded radio frequency environment.

Further, the Cellular Telecommunications & Internet Association (CTIA) require communication systems to meet specified values for TIS and TRP, expressed in dBm, for each frequency band that is supported by the product. More specifically, communication systems operating in the 850 MHz band are required to meet an absolute, quantitative value of −99 dBm for the total isotropic sensitivity. Additionally, communication systems operating in the 1900 MHz band are required to meet a quantitative value of −101.5 dBm for the total isotropic sensitivity. Similarly, the total radiated power value is 22 dBm for communication systems operating in the 850 MHz band and is 24.5 dBm for communication systems operating in the 1900 MHz band. Communication systems which do not conform to these new performance requirements are not certified or granted access to the wireless carrier's network.

Utility meters, such as wireless electricity meters, that access public wireless networks are an example of this communication system. Wireless electricity meters that used previous antenna designs failed to pass these new and stringent certification requirements. As a result, previous antenna designs failed the wireless product certification process that was, and still is, required by the Cellular Telecommunications & Internet Association.

One previous antenna design embedded the antenna inside the wireless electricity meter. The antenna was embedded within the communications circuit board, located inside of a dielectric housing under the meter cover, wherein the antenna conformed to the internal surface of the dielectric housing. Such designs degraded the over-the-air, system performance by introducing unintentional sources of interference such as noise coupling and signal reflection.

Other designs positioned the antenna outside of the meter cover. This design often draws unwanted attention to the external antenna. An external antenna positioned outside of the meter cover introduces installation and maintenance problems for the customer. Other issues include destruction of the antenna by the weather, people, or other circumstances. In addition, gains (dBm) of an external antenna are reduced due to coax cable losses that exist between the external antenna and the wireless modem device located within the wireless electricity meter. Moreover, the antenna's system level performance is adversely impacted by the presence of radiated noise emitted from electronic components and metal structures within the meter. Consequently, the uniformity of the antenna's transmit and receive patterns, the values of the total radiated power, and the values of the total isotropic sensitivity are adversely impacted.

For these and other reasons, there is a need for a system that addresses over-the-air, system level performance of wireless utility meters.

SUMMARY OF THE INVENTION

The present invention provides systems and methods for a forward throw antenna utility meter for use in wireless meter reading applications. One embodiment provides a utility meter assembly comprising: a plurality of meter components configured for measuring and collecting data, the meter components including a transceiver operative for signal communications over a wireless network; a faceplate, configured such that meter reading information is displayed on the front of the faceplate; an exterior cover configured to enclose meter components and the faceplate, wherein the faceplate is forward of the plurality of meter components; and an internal dipole antenna situated within the exterior cover, wherein the internal dipole antenna is beyond the front of the faceplate and toward the front of the utility meter assembly. The antenna is typically tuned for optimal matching impedance in an 850 MHz or 1900 MHz receiving band, so that the desired receiving band Standing Wave Ratio (SWR) is achieved, and also a specified minimum radiated power threshold is maintained.

Another embodiment provides a method for assembling a utility meter comprising: selecting a plurality of meter components configured for measure and collection of data, the meter components including a transceiver operative for signal communications over a wireless network; securing a faceplate forward of the meter components; inserting an internal dipole antenna forward of the faceplate; and covering the internal dipole antenna with an exterior cover, wherein the internal dipole antenna is situated toward the front of the utility meter.

Other systems, methods, features and advantages of the present invention will be or become apparent to one with skill in the art upon examination of the following drawings and detailed description. It is intended that all such additional systems, methods, features and advantages be included within this description and be within the scope of the present disclosure.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 5A is a table of sensitivity measurements, used in the calculation of total isotropic sensitivity value across the 850 band for channel 128 for theta polarization at a test frequency of 869.2 MHz, for the antenna used in FIG. 2.

FIG. 5B is a table of sensitivity measurements, used in the calculation of total isotropic sensitivity value across the 850 band for channel 128 for phi polarization at a test frequency of 869.2 MHz, for the antenna used in FIG. 2.

FIG. 6 is a mathematical equation for calculating the total isotropic sensitivity.

FIG. 8A illustrates a table of radiated power measurements used in the calculation of total radiated power value across the 850 band for channel 128 for theta polarization and showing phi angle from 0 degrees to 180 degrees at a test frequency of 824.2 MHz, for the antenna used in FIG. 2.

FIG. 8B illustrates a table of radiated power measurements, used in the calculation of total radiated power value across the 850 band for channel 128 for theta polarization and showing phi angle from 195 degrees to 360 degrees at a test frequency of 824.2 MHz, for the antenna used in FIG. 2.

FIG. 8C illustrates a table of radiated power measurements, used in the calculation of total radiated power value across the 850 band for channel 128 for theta polarization and showing phi angle from 0 degrees to 180 degrees at a test frequency of 824.2 MHz, for the antenna used in FIG. 2.

FIG. 8D illustrates a table of radiated power measurements, used in the calculation of total radiated power value across the 850 band for channel 128 for theta polarization and showing phi angle from 195 degrees to 360 degrees at a test frequency of 824.2 MHz, for the antenna used in FIG. 2.

FIG. 9 illustrates a mathematical equation for calculating the total radiated power, for the antenna used in FIG. 2.

FIG. 11A illustrates a table of sensitivity measurements, used in the calculation of total isotropic sensitivity value across the 850 band for channel 190 for theta polarization at a test frequency of 881.6 MHz, for the antenna used in FIG. 2.

FIG. 11B illustrates a table of sensitivity measurements, used in the calculation of total isotropic sensitivity value across the 850 band for channel 190 for phi polarization at a test frequency of 881.6 MHz, for the antenna used in FIG. 2.

FIG. 12A illustrates a table of sensitivity measurements, used in the calculation of total isotropic sensitivity value across the 850 band for channel 251 for theta polarization at a test frequency of 893.8 MHz, for the antenna used in FIG. 2.

FIG. 12B illustrates a table of sensitivity measurements, used in the calculation of total isotropic sensitivity value across the 850 band for channel 251 for phi polarization at a test frequency of 893.8 MHz, for the antenna used in FIG. 2.

FIG. 13A illustrates a table of radiated power measurements, used in the calculation of total radiated power value across the 850 band for channel 190 for theta polarization and showing phi angle from 0 degrees to 180 degrees at a test frequency of 838.6 MHz, for the antenna used in FIG. 2.

FIG. 13B illustrates a table of radiated power measurements, used in the calculation of total radiated power value across the 850 band for channel 190 for theta polarization and showing phi angle from 195 degrees to 360 degrees at a test frequency of 838.6 MHz, for the antenna used in FIG. 2.

FIG. 14A illustrates a table of radiated power measurements, used in the calculation of total radiated power value across the 850 band for channel 190 for phi polarization and showing phi angle from 0 degrees to 180 degrees at a test frequency of 838.6 MHz, for the antenna used in FIG. 2.

FIG. 14B illustrates a table of radiated power measurements, used in the calculation of total radiated power value across the 850 band for channel 190 for phi polarization and showing phi angle from 195 degrees to 360 degrees at a test frequency of 838.6 MHz, for the antenna used in FIG. 2.

FIG. 15A illustrates a table of radiated power measurements, used in the calculation of total radiated power value across the 850 band for channel 251 for theta polarization and showing phi angle from 0 degrees to 180 degrees at a test frequency of 848.8 MHz, for the antenna used in FIG. 2.

FIG. 15B illustrates a table of radiated power measurements, used in the calculation of total radiated power value across the 850 band for channel 251 for theta polarization and showing phi angle from 195 degrees to 360 degrees at a test frequency of 848.8 MHz, for the antenna used in FIG. 2.

FIG. 16A illustrates a table of radiated power measurements, used in the calculation of total radiated power value across the 850 band for channel 251 for phi polarization and showing phi angle from 0 degrees to 180 degrees at a test frequency of 848.8 MHz, for the antenna used in FIG. 2.

FIG. 16B illustrates a table of radiated power measurements, used in the calculation of total radiated power value across the 850 band for channel 251 for phi polarization and showing phi angle from 195 degrees to 360 degrees at a test frequency of 848.8 MHz, for the antenna used in FIG. 2.

DETAILED DESCRIPTION OF THE EMBODIMENTS

Figure 1:
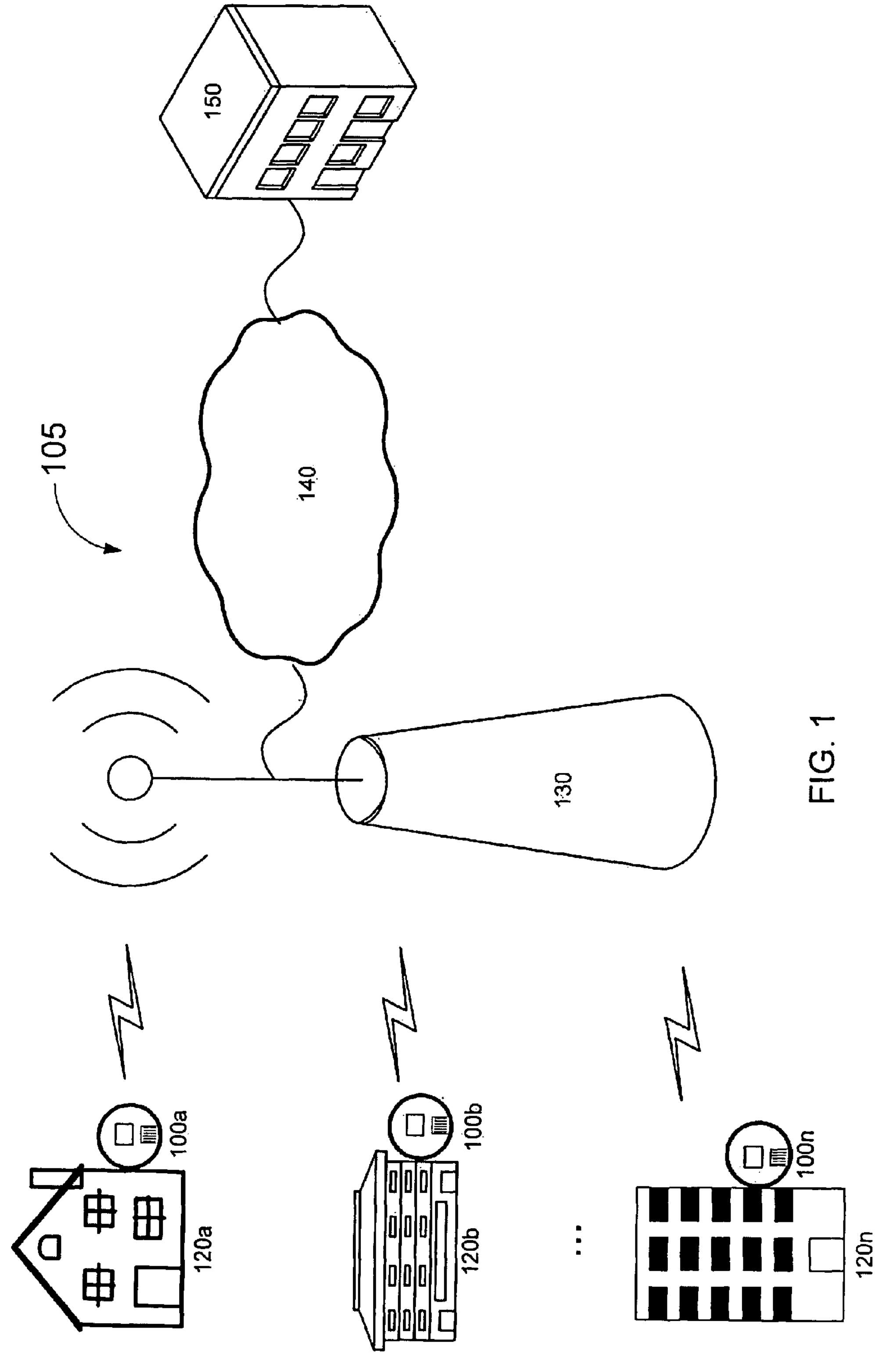
FIG. 1 illustrates a system for a remote meter reading system operating on a wireless communications network.

Reference is now made in detail to the description of the embodiments of systems and methods for automatic configuration of a generic digital device on a wireless network as illustrated in the drawings. The invention may, however, be embodied in many different forms and should not be construed as limited to the embodiments set forth herein; rather, these embodiments are intended to convey the scope of the invention to those skilled in the art. Furthermore, all "examples" given herein are intended to be non-limiting.

Turning attention to the drawings, FIG. 1 illustrates an exemplary embodiment of a remote meter reading system 105 for reading utility meters using a wireless network. The remote meter reading system 105 comprises wireless utility meters 100*a*, 100*b*, 100*n* located at respective client sites 120*a*, 120*b*, 120*n*. Of course the remote meter reading system 105 may contain any number of client sites 120 and wireless utility meters 100. The wireless utility meter 100 communicates bi-directionally through a network 140 with a remote monitoring station 150. The wireless utility meter 100 connects to the network 140 through an access point 130. The network 140 may contain traditional wired networks, wireless networks, or some combination of both. For example, a communication network 140 may include terrestrial communications networks, such as, for example, the public switch telephone network, as well as celestial communications networks. Other examples of networks include the Internet, local area networks (LAN), wide area networks (WAN), and WiFi, among others.

In one embodiment of the present invention, the remote meter reading system 105 includes an access point 130 that is operative for receiving and transmitting radio frequency signals. The access point 130 provides bi-directional data communication between a wired network and a wireless network. The access point 130 is an integral communications link that is part of the wireless carrier's communication network such as, for example, AT&T, Sprint, and Verizon, among others.

The remote meter reading system 105 further comprises a remote monitoring station 150 that monitors wireless utility meters 100 at client sites 120. The remote monitoring station 150 is connected to computer equipment that enables a wireless data communications link at the remote monitoring station 150.

Upon receipt of a meter request from the remote monitoring station 150, the wireless utility meter 100 processes the meter request and transmits the requested meter information or other data to the access point 130. The meter information includes data such as meter status, meter readings, measurements, and requests for information, for example. The meter information is wirelessly transmitted from the wireless utility meter 100 to the remote monitoring station 150 over the network 140. The incoming meter information is received at the access point 130. Then, the metering information passes through the public network 140. Next, the meter information is transported to the remote monitoring station 150. The remote monitoring station 150 receives the requested meter information from the wireless utility meter 100 and processes the requested meter information.

It will be understood and appreciated by those skilled in art that a remote meter reading system 105 can be adapted for alternative configurations having multiple wireless utility meters 100, multiple access points 130, and even multiple remote monitoring stations 150.

Figure 2:
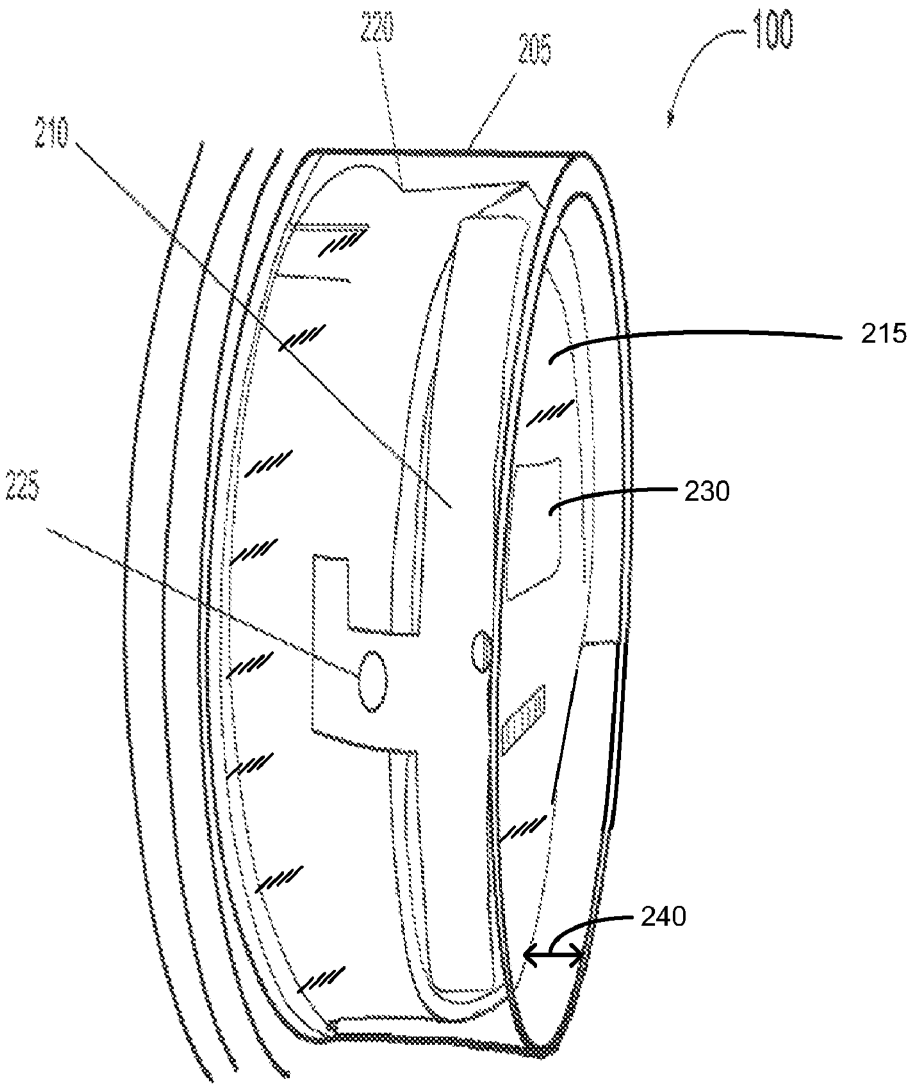
FIG. 2 illustrates a utility meter having an antenna for use in a remote reading system operating on the wireless network of FIG. 1.

FIG. 2 illustrates a wireless utility meter 100 having an antenna 210 for use in the remote meter reading system 105. The wireless utility meter 100 comprises a meter cover 205, meter components (not shown), and an antenna 210 tuned for use under the meter cover 205. In a preferred embodiment of the wireless utility meter 100, the antenna 210 is typically a forward throw dipole antenna. It will be readily understood by those skilled in the art, that other antennas could be used in the wireless utility meter 100, such as a wipe antenna, among others. The antenna 210 is optimized in a forward throw position and compromised in the 850 MHz and 1900 MHz band transmit standing wave ratio 300 SWR to account for subsequent over-the-air test for product certification. In some embodiments, the wireless utility meter 100 includes a secondary cover 220.

In one embodiment, the exterior meter cover 205 protects the wireless utility meter 100 from potential damages that can be inflicted by external destructive forces, such as weather, for example. Other damages can be inflicted by meter tampering, destructive objects, or other acts of destructions. The secondary cover 220, situated within the exterior meter cover 205, encloses meter components (not shown). The meter components include, for example, a wireless transceiver, electrical circuitry, metal meter structure, and other electrical and metal components. The wireless transceiver, together with the other meter components, provide for signal transmission over a wireless communication network.

If a secondary cover 220 is present, the antenna 210 can be adjoined to its exterior surface. Optionally, the secondary cover 220 also serves as a supporting member for a mechanical connection point 225. The antenna 210 is selectively disposed on and mounted to the secondary cover 220 at the mechanical connection point 225. The antenna 210 is conformed to the curved shape of the secondary cover 220 and is positioned forward of its mechanical connection point 225, so that it is contiguously spaced at a position forward of the front of the meter components, yet under the meter cover 205 for improved performance.

The connection point 225 is disposed on a portion of the surface of the secondary cover 220. The secondary cover 220 encloses and protects the meter components and serves as a supporting member to mount the antenna 210. Further, the antenna 210 is positioned away from unwanted interference that originates from the electronic parts and the metal meter structure. Typically, the antenna 210 is located external to the secondary cover 220 in a manner that optimizes the antenna's system level performance.

In another embodiment, the wireless utility meter 100 may comprise a simple faceplate component 215. The faceplate component 215 provides a surface for displaying meter reading identifiers such as the serial number, bar code, brand, model number, and regulatory information, among others. The faceplate component 215 may be a dedicated cover. The antenna 210 may be disposed on the faceplate component 215 and mounted forward of the internal meter components. Typically, the faceplate component 215 is located in front of the internal meter components. It will be readily understood by those of skill in the art that wireless utility meters 100 include a faceplate component 215 for displaying metering identifiers such as serial numbers, bar code, brand, model number, and regulatory information, among others. The faceplate 215 is typically implemented as the front of a dedicated cover for the meter internal components, an extension 230 of a metering information component (i.e., an LCD board), or a plastic piece affixed by dedicated supports, among others. It should be noted that many designs can be devised for implementing a faceplate.

Alternatively, the function of the faceplate component 215 may be carried out by an extension 230 of the meter information components such as the LCD board, among others. The antenna 210 may be configured to be supported by the LCD board and forward of the internal meter components and the LCD board/faceplate 230.

Further, in another embodiment of the wireless utility meter 100, the faceplate component 215 is a plastic piece, suspended in front of the internal meter components and upheld by simple supports within the wireless utility meter 100. The antenna 210 is typically supported by the faceplate component 215 and configured forward of the faceplate and the internal meter components.

In another embodiment, the faceplate component 215 encloses the internal meter components. The antenna 210 is attached to the faceplate component 215 and configured forward of the internal meter components in a space 240 defined between the faceplate component 215 and the meter cover 205.

In another embodiment, the antenna 210 is held inside the wireless utility meter 100 by the meter cover 205 and disposed forward of the internal meter components.

In another embodiment, the antenna 210 may be configured, so that it is free standing within the wireless utility meter 100.

Typically, the wireless utility meter 100 comprises an antenna 210 operative for transmitting and receiving meter information via the infrastructure of a wireless communication network system at the appropriate carrier frequencies. An antenna 210 enables a remote meter reading system 105, such as a wireless electricity metering system, to meet system level certification thresholds. The remote meter reading system 105 should meet system level certification thresholds, so that the remote meter reading system 105 can utilize the network 140 for bi-directional communication of metering information. The system level certifications include measurements of total isotropic sensitivity and total radiated power.

For an electricity metering system, the wireless utility meter 100 may include a variety of manufacturers and models such as Itron's CENTRON, SENTINEL, Elster's A3 ALPHA, and General Electric's KV2C among others. Nevertheless, it will be appreciated by those skilled in the art that the present invention is not limited to any particular meter manufacturer or model. It should also be understood that the wireless utility meter 100 may be used for water, natural gas, or other services that require metering. The wireless utility meter 100 is not limited to electrical meter reading.

The antenna substantially reduces un-intentional interferences that are introduced by the meter components and other metal structures that normally affect the reception and the transmission capability of existing antenna designs. Another principal advantage of the present invention is that the antenna 210 provides a reliable level of improved performance, so that the wireless utility meter 100 is operative to meet system level, certification requirements including total isotropic sensitivity and total radiated power thresholds.

In one embodiment of the present invention, the antenna 210 is 5.2 inches long and 0.9 inches wide. The center-fed driven element has a width of 0.725 inches and a length of 0.5 inches. Further, the antenna 210 is concealed by a DuPont™ Pyralux® FR coversheet material with a total finish thickness of 0.0178+/−10% for providing environmental protection and electrical insulation. It should be noted that other conductor shapes and materials are well within the scope of the present invention.

A synopsis of the total isotropic sensitivity (TIS) and the total radiated power (TRP) is provided for clarity and further understanding of the present invention. Total radiated power is measured by capturing data about the radiated transmit power of the wireless utility meter 100 at various locations surrounding the device. Total radiated power data provides key measurements that demonstrate whether the wireless utility meter 100 is performing according to the wireless carriers' performance criteria. Further, the total radiated power measurements characterize the amount of power radiated from the wireless utility meter 100. Similarly, the total isotropic sensitivity indicates the lowest signal strength the wireless utility meter 100 can receive (Bit Error Rate is approximately 2.44%). More particularly, the total isotropic sensitivity demonstrates the wireless utility meter's 100 ability to detect a low power signal. TIS and TRP measurements are described in further detail below by examining three-dimensional patterns that characterize TIS and TRP and by examining the quantitative values revealed during a plurality of test.

The Cellular Telecommunications & Internet Association (CTIA) requires communication systems to meet specified values for TIS and TRP, expressed in dBm, for each frequency band that is supported by the product. For use in communication systems under CTIA guidelines, the wireless utility meter 100 is required to meet system level, certification requirements for TIS and TRP thresholds. More specifically, communication systems operating in the 850 MHz band are required to meet an absolute, quantitative value of −99 dBm for the total isotropic sensitivity. Similarly, the total radiated power value requirement is 22 dBm for communication systems operating in the 850 MHz band. Communication systems, which do not conform to these performance requirements, are not certified or granted access to the wireless carrier's network. The present invention provides a total isotropic sensitivity absolute, quantitative value approximately equal to −99.52963 dBm and a total radiated power value approximately equal to 25.73156 in the 850 MHz frequency band.

Communication systems operating in the 1900 MHz band are required to meet an absolute, quantitative value of −101.5 dBm for the total isotropic sensitivity. In another embodiment, the present invention provides a total isotropic sensitivity absolute, quantitative value approximately equal to −104.290928934911 in the 1900 MHz frequency band, wherein the TIS absolute, quantitative value is −105.026507727191 dBm in channel 512 at a frequency of 1930.2 MHz, −103.716792318205 in channel 661 at a frequency of 1960 MHz, and −104.129486759337 dBm in channel 810 at a frequency of 1989.8 MHz.

Further, the TRP requirement is 24.5 dBm for communication systems operating in the 1900 MHz band. The present invention provides a TRP of approximately 27.082033 dBm in 1900 MHz frequency band, wherein the TRP value is approximately equal to 26.6719 dBm in channel 512 at a frequency of 1850.2 MHz, 27.3266 dBm in channel 661 at a frequency of 1880 MHz, and 27.2476 dBm in channel 810 at a frequency of 1909.8 MHz.

These TRP and TIS thresholds are affected by meter components and other factors, such as power losses due to impedance mismatch. Impedance mismatches adversely reflect power back into the source and, in turn, diminish the amount of power that is forwarded to the antenna 210 from the transmitter. Further, this mismatch diminishes the amount of energy that should be transferred to the receiver from the antenna 210. To mitigate these losses, the antenna 210 is tuned for improved performance by optimizing for the receive band sensitivity by adjusting the impedance of the antenna 210 to more closely match the impedance of the transmission line, while compromising the transmit efficiency. Such mitigation is illustrated in FIG. 3.

Figure 3:
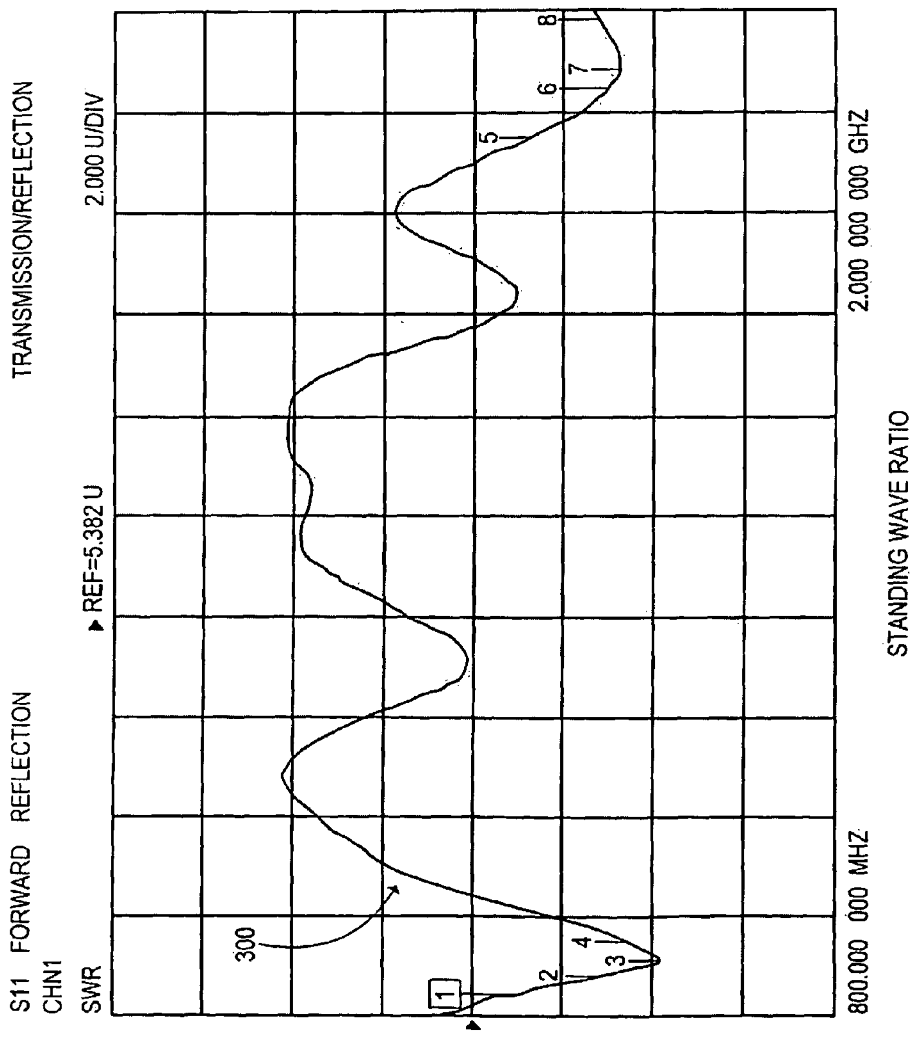
FIG. 3 illustrates a standing wave ratio of the antenna in the 850 MHz band and the 1900 MHz band, for the antenna used in FIG. 2.

Turning now to FIG. 3, illustrated is a standing wave ratio (SWR) 300, also referred to as voltage standing wave ratio (VSWR), of the antenna 210 in the 850 MHz band and the 1900 MHz band. The present invention is tuned and optimized by more closely matching the impedance in the receive bands to increase receiver sensitivity in order to meet the total sensitivity threshold requirements. Increased sensitivity is achieved by compromising the standing wave ratio 300 in the transmit bands, and more particularly, the 850 MHz and 1900 MHz frequency bands. Essentially, the antenna's system performance is penalized in the transmit band and thus, reducing the total power radiated by the antenna 210. While there is a reduction in radiated power, the antenna 210 is selectively tuned to allow sufficient energy transfer to the transmitter. Hence, the wireless utility meter 100 still meets the TRP thresholds. Accordingly, the antenna 210 location and orientation, combined with a voltage standing wave characteristic 300 that optimizes the 850 MHz and 1900 MHz band receive sensitivity while comprising the 850 MHz and 1900 MHz band transmit efficiency, yields over-the-air test results that meet or exceed certification requirements.

Figure 4:
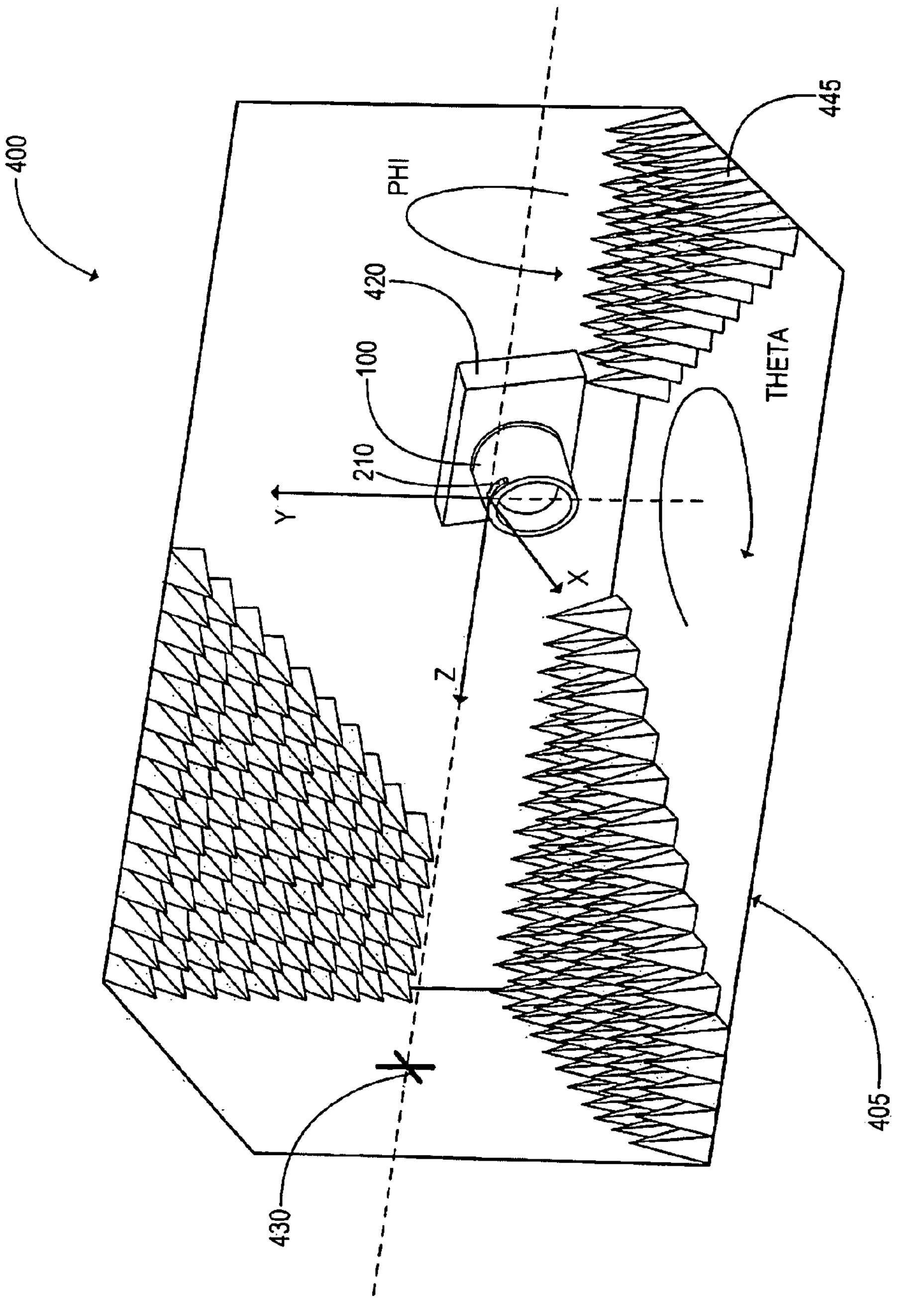
FIG. 4 illustrates a test environment for generating the total isotropic sensitivity and the total radiated power measurements, according to the utility meter of FIG. 2.

The standing wave ratio 300 characterizes the amount of power reflected back by the antenna 210 at a specific frequency across the receive bands and the transmit bands. Also, the standing wave ratio 300 conveys the impedance of the tuned antenna 210, as shown in FIG. 4. A thorough coverage of the standing wave ratio 300, necessitates a discussion of the relationship between the standing wave ratio 300, reflected power, and impedance matching.

The standing wave ratio 300 is a mathematical expression indicating the non-uniformity of an electromagnetic field on a transmission line, such as coaxial cable, for example. It is a stationary sinusoidal wave that measures the voltage and inherently varies sinusoidally along the length of the transmission line from the transceiver to the antenna 210. In theory, the voltage measured along the transmission should be the same in an antenna system, in which case, the impedance of the antenna 210 is matched to the impedance of the transmission line. Hence, the sinusoidal standing waveform is non-existent in the transmission line, and a maximum power transfer takes place between the antenna 210 and the transmitter and between the antenna 210 and the receiver. When the impedance of the antenna 210 and the transmission line are matched, the voltage along the transmission line is the same. Thus, the reflected power is nominal, and the standing wave ratio 300 is equal to one.

However, if the impedance of the antenna 210 is not matched to the impedance of the transmission line, then some of the forward power is reflected by the antenna 210, and power is transferred back toward the transceiver. Simply put, energy is reflected back to the receiver from the antenna 210, and similarly, energy is reflected back to the transmitter from the antenna 210. Hence, if the impedance of the antenna 210 and the impedance of the transmission line are not perfectly matched, then a percentage of the forward power is reflected by the antenna system. As a result, the SWR is some number greater than one.

In one embodiment of the present invention, the SWR is adjusted to optimize the antenna 210 for the receiver sensitivity. FIG. 3 is a graph illustrating the standing wave ratio 300 characteristics of the antenna 210. The antenna 210 is optimized for the 850 MHz and 1900 MHz band receive sensitivity by compromising transmit efficiency across the 850 MHz and 1900 MHz bands to account for subsequent over-the-air value, necessary for certification. In FIG. 3, the standing wave ratio 300 comprises eight (8) markers, one (1) through eight (8), that correspond to a specific SWR value for a particular frequency across the receive bands and the transmit bands. Such data is represented in a tabular format in a table, identified as Table one (1), in FIG. 3 and is explained in subsequent details.

Referring now to Table 1, the markers one (1) through four (4) represent the 850 MHz frequency band. The markers, one (1) and two (2), correspond to frequencies, 824 MHz and 848 MHz, respectively, and represent the modem's transmit band or uplink from 824 MHz to 848 MHz. The markers, three (3) and four (4), correspond to frequencies, 869 MHz and 893 MHz, respectively, and represent the modem's receive band or downlink from 869 MHz to 893 MHz. Likewise, in the 1900 band, the markers, five (5) and six (6), correspond to frequencies, 1850 MHz and 1910 MHz, respectively, and represent the transmit band or uplink from 1850 MHz to 1910 MHz. The markers, eight (7) and eight (8), correspond to frequencies 1931 MHz and 1991 MHz, respectively, and represent the downlink or receive band from 1931 MHz to 1991 MHz. The SWR value across the 850 MHz transmit band at markers one (1) and two (2) are 4.759 and 2.819, respectively. The SWR value across the 850 MHz receive band at markers three (3) and four (4) are 1.193 and 1.951, respectively. Likewise, the SWR value across the 1900 MHz transmit band at markers five (5) and six (6) are 4.145 and 2.325, respectively. The SWR value across the 1900 MHz receive band at markers seven and eight are 2.118 and 2.589, respectively. The following details further describe the aspects of the standing wave ratio 300 in both transmit and receive bands.

According the present invention, the antenna 210 is optimized by more closely matching the impedance in the receive bands to increase receiver sensitivity in order to meet the TIS threshold requirements. As recited above, SWR values in the 850 MHz receive band at markers three (3) and four (4) are 1.193, and 1.951, respectively. Hence, the antenna 210 is optimized by more closely matching the impedance in the receive band to increase receiver sensitivity in order to meet the total sensitivity threshold requirements. The antenna standing wave ratio values for the receive band are achieved by compromising the standing wave ratio 300 in the transmit band. Consequently, the standing wave ratio 300 across the 850 MHz transmit band at markers one (1) and two (2) are 4.759 and 2.819, respectively. Essentially, the antenna system is penalized on the transmit band and thus, reducing the total power radiated by the antenna 210. While there is a reduction in radiated power, the antenna 210 is intentionally tuned to allow sufficient energy transfer between the antenna 210 and the transmitter. Hence, the antenna 210 provides a reliable level of performance, so that the wireless utility meter 100 meets the total radiated power and total sensitivity thresholds. Similarly, in the 1900 MHz band, the antenna 210 is optimized by more closely matching the impedance in the receive band to increase receiver sensitivity in order to meet the total isotropic sensitivity and total radiated power thresholds, and likewise, the antenna 210 provides a reliable level of performance in the wireless utility meter 100.

The details above describe how the antenna 210 is tuned for use under the meter cover 205, so that the antenna system meets the total radiated power and total isotropic sensitivity thresholds. Turning now to FIG. 4, an overall summary of a test environment 400 for performing over-the-air test, total isotropic sensitivity and total radiated power, is shown. The test environment 400 comprises a RF chamber 405, a wireless utility meter 100 that is overlaid on a polar and Cartesian coordinate system, a supporting member 420, a measurement antenna 430, an antenna 210, and a RF wave absorbing material 445. The antenna 210 is tuned and optimized as noted above in reference to FIG. 3.

The improved, internal antenna configuration is confirmed by employing a RF test environment 400 to measure the total isotropic sensitivity and total radiated power during the operation of the wireless utility meter 100 in an anechoic RF chamber 405. Additionally, the test results and toroidal patterns demonstrate that the present invention meets or exceeds the total radiated power and the total isotropic sensitivity thresholds.

The improved, internal antenna 210 provides an optimal level of performance, when distinctly disposed on a portion of the outer surface of the secondary cover, yet under the meter cover and more particularly, configured forward of the meter components. The configuration is operative for providing a reliable level of performance in the communication system or the wireless utility meter 100 that undergoes the quantitative certification test for total isotropic sensitivity and total radiated power.

Further, the antenna system provides an acceptable level of performance for use in a public wireless communication network, and quantitatively, the level of performance delivered by this invention is comparable to the performance of the newest cell phones available on the market today. The location and orientation of the present invention corresponds to the successful total isotropic sensitivity and to the successful total radiated power measurements and is confirmed by employing the test environment, described in the following details.

In the test environment shown in FIG. 4, the antenna 210 is electrically connected to the wireless utility meter 100 and is adapted to operate across the 850 MHz band and the 1900 MHz band. As described above by reference to FIG. 2, the antenna 210 is conformed to the curved shape of the secondary cover 220 and is positioned forward of its mechanical connection point 225, so that it is contiguously spaced at a position forward of the front of the meter components, yet under the meter cover 205 for improved performance.

The wireless utility meter 100 is adjoined to the supporting member 420 that is mounted on the rear panel of the RF chamber 405. The supporting member 420 serves as a platform for concurrently rotating the antenna 210 and the wireless utility meter 100 about the y and z axis in both theta and phi angles. The process for generating the TIS and TRP measurements is described in the subsequent details.

First, a general synopsis is provided to illustrate the total isotropic sensitivity measurements using the antenna 210. The total isotropic sensitivity, also referred to as receiver sensitivity, is measured using a calibrated power measurement device in a controlled environment. It is calculated for 3 channels (low, middle and high) across each frequency band supported by the wireless utility meter 100 and is captured in both theta (horizontal) polarizations and phi (vertical) in angles, theta and phi (θ, ϕ).

Generally, the supporting member is rotated to an angle, specified by phi and theta. Then the power level of the transmitting signal that is received by the antenna 210 is varied by raising or lowering the level. The iteration of varying the power level of the transmitting signal is repeated until the bite-error-rate equals the target bit-error-rate. In particular, the bit-error-rate is used to evaluate the effective receiver sensitivity at each spatial measurement location specified by the theta angle and the phi angle. When the target bit-error-rate is achieved, the power level at the meter is recorded as a receiver sensitivity data point This is repeated at an angle every 30 degrees for both polarizations.

Still referring to FIG. 4, the supporting member 420 is horizontally rotated around the azimuth axis z at 30 degree angular intervals from 0 to 360 phi, while the theta angle is held constant. At each 30 degree angular interval, a sensitivity measurement is captured in the theta (θ) and phi (ϕ) axes in both theta polarization and phi polarization, thereby generating a total of 72 measurements for each polarization to characterize the receiver sensitivity. While capturing the measurements, the measurement antenna 430 accounts for variations in measurements and allows for measuring the horizontally and vertically polarized signals for the effective receiver sensitivity. These measurements are captured for three (3) frequency channels (low, middle, high) across the supporting frequency bands and are illustrated as data points in the table shown in FIG. 5.

Turning now to FIG. 5, a table displays system, effective receive sensitivity data points 500 for channel 128 and for theta and phi polarizations across the 850 MHz band at a test frequency of 869.2 MHz. The table illustrates the effective receiver sensitivity data points 500 derived from the test environment provided in FIG. 4. Though only channel is represented, the total isotropic sensitivity is represented as a composite of receiver sensitivity data points 500 for each 30 degree angular interval and for channels 128, 190, and 251 (low, middle, and high) across the 850 MHz band for theta and phi polarizations. FIG. 11 and FIG. 12 provide additional effective isotropic sensitivity measurements captured at each angular interval (θ, ϕ) across the 850 MHz operating frequency band for channels 128, 190, and 251 for theta and phi polarizations. Such data points for each channel are utilized for calculating the total isotropic sensitivity.

Turning now to FIG. 6, illustrated is a mathematical equation 605 that is used to calculate the total isotropic sensitivity for each channel wherein EIS is the effective isotropic sensitivity captured in the theta and phi axis. The mathematical equation 605 is $$TIS \cong \frac{2NM}{\pi \sum_{i=1}^{N-1} \sum_{j=0}^{M-1} \left[ \frac{1}{EIS_\theta(\theta_i, \phi_j)} + \frac{1}{EIS_\phi(\theta_i, \phi_j)} \right] \sin(\theta_i)}.$$

Further, N and M are the number of angular intervals in theta and phi, respectively. I and J are theta and phi indices, respectively, that correspond to the measurement angles. The total isotropic sensitivity in the 850 MHz band is equal to the average of the total isotropic sensitivity in channels 128, 190 and 251. Thus, the total isotropic value for the 850 MHz band is equal to (Ch 128 TIS+Ch 190 TIS+Ch 251)/3. The total isotropic sensitivity value for channels 128, 190, and 251 are −98.8557 (dBm), −102.039 (dBm), and −97.6942 (dBm), respectively. With reference to equation 605, the total isotropic sensitivity data becomes a single value equal to −99.52963 dBm, which meets the certification requirement.

The total radiated power and the total isotropic sensitivity measurements are represented as a three dimensional toroidal radiation pattern and a three dimensional toroidal sensitivity pattern. The patterns represent the performance of the system and echo the transmission and reception characteristics of the system.

Figure 7:
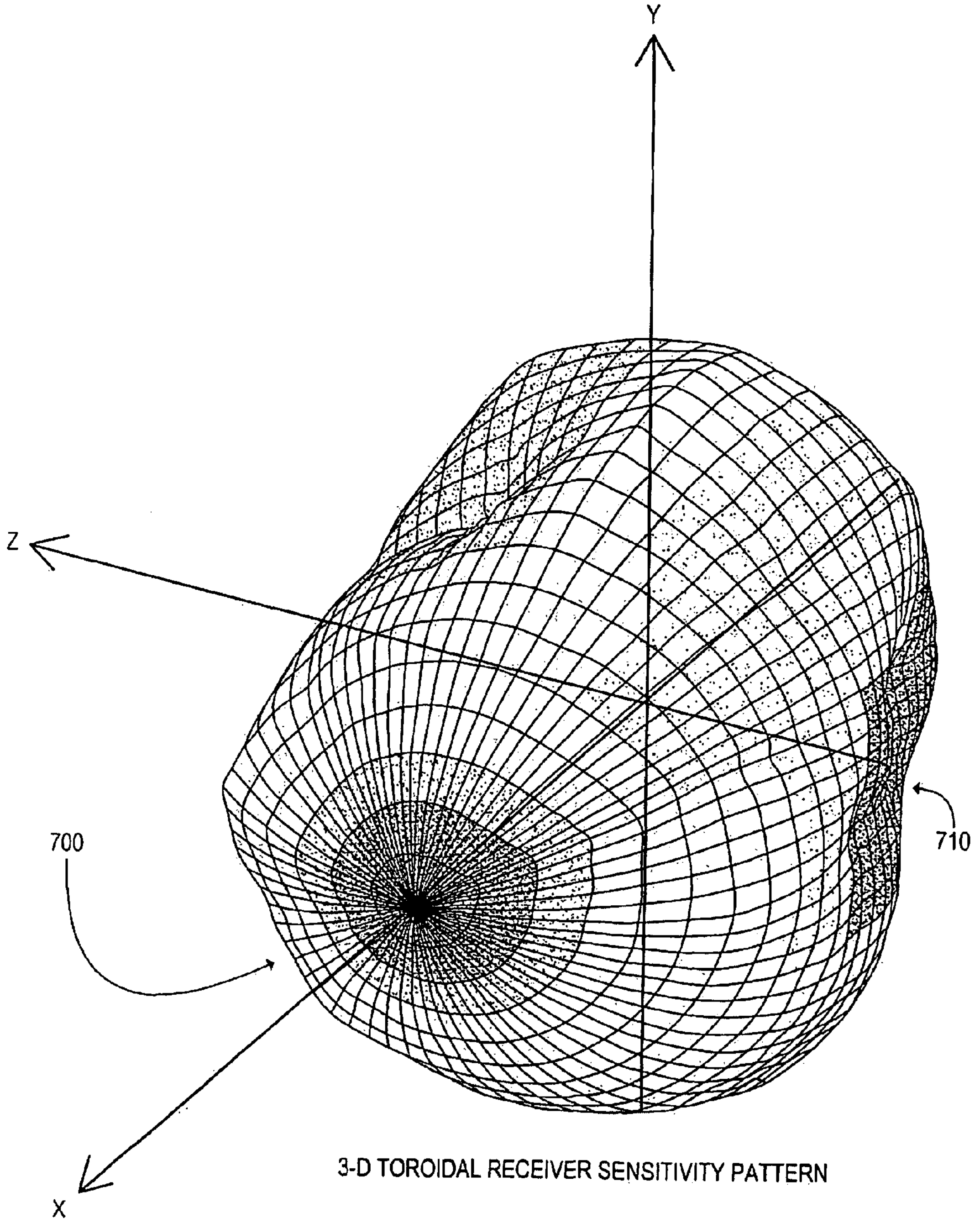
FIG. 7 illustrates a toroidal three dimensional, system receive sensitivity pattern for the 850 MHz band, for the antenna used in FIG. 2.

Referring now to FIG. 7, a toroidal three dimensional sensitivity pattern characterizes the receiver's system performance for the 850 MHz band. The pattern displays a null 710 and a hot 700 spot and represents the data points that are derived from the spatially distributed power measurements, captured every 30 degrees (θ, ϕ), as described above. The null 710 conveys that the system is not sensitive to signals that fall in that particular shaded region. However, the null 710 is behind the meter and thus, does not affect system performance. More significantly, the pattern displays strong sensitivity in the hot spot 700. The antenna 210 receives or "hears" low signals which correspond to the total isotropic sensitivity requirements. The shaded region in the hot spot 700 corresponds to a power level of approximately −99.5 dBm or better. In simplistic terms, the shaded region in the Hot Spot 700 indicates that the antenna 210 provides a reliable level of performance, so that the wireless utility meter 100 meets or exceeds the total isotropic sensitivity threshold requirements. It will be understood in the art, that the wireless utility meter 100 would be overlaid on the x y z coordinate system of FIG. 7, as shown in FIG. 4.

Likewise, the total radiated power also characterizes the overall system performance. Referring now to FIGS. 8A and 8B, a table displays system, effective radiated isotropic power data points 800 for channel 128 and for the theta polarization across the 850 MHz band at a test frequency of 824.2 MHz. These data points 800 in FIGS. 8A and 8B are captured in the theta (θ) and phi (ϕ) axes by sampling the radiated transmit power in free space around the meter in the test environment, as described in FIG. 4, with the following exception: the angular dependence is 15 degrees. Though only one channel and polarization is discussed, the total radiated power is calculated as a composite of data points 800 for theta and phi polarizations and for channels 128, 190, and 251 across the 850 MHz band. Refer to FIGS. 13A and 18B for additional effected isotropic radiated power data points. Such data points for each channel are used for calculating the total radiated power.

Referring now to FIG. 9, illustrated is a mathematical equation 900 that is used to calculate the total radiated power for each channel wherein EIRP is the effective isotropic radiated power captured in the phi and theta axes. The mathematical equation 900 is $$TRP \cong \frac{\pi}{2NM}\sum_{i=1}^{N-1}\sum_{j=0}^{M-1}\left[EiRP_{\theta}(\theta_i,\phi_j)+EiRP_{\phi}(\theta_i,\phi_j)\sin(\theta_i)\right].$$

Further, N and M are the number of angular intervals in Theta and Phi, respectively. I and J are theta and phi indices, respectively, that correspond to the measurement angles. The total radiated power in the 850 MHz band is equal to the average of the total radiated power in channels 128, 190, and 251. Thus, the total radiated power is equal to (Ch 128 TRP+Ch 190 TRP+Ch 251 TRP)/3. With respect to the equation, the total radiated power values for channels 128, 190, and 251 are 24.0264 dBm, 25.4058 dBm, and 27.7625 dBm, respectively. Thus, the total radiated power data points become a single value equal to 25.73156, which meets the CTIA certification threshold. These measurements result in a toroidal radiation pattern that characterizes the total radiated power.

Figure 10:
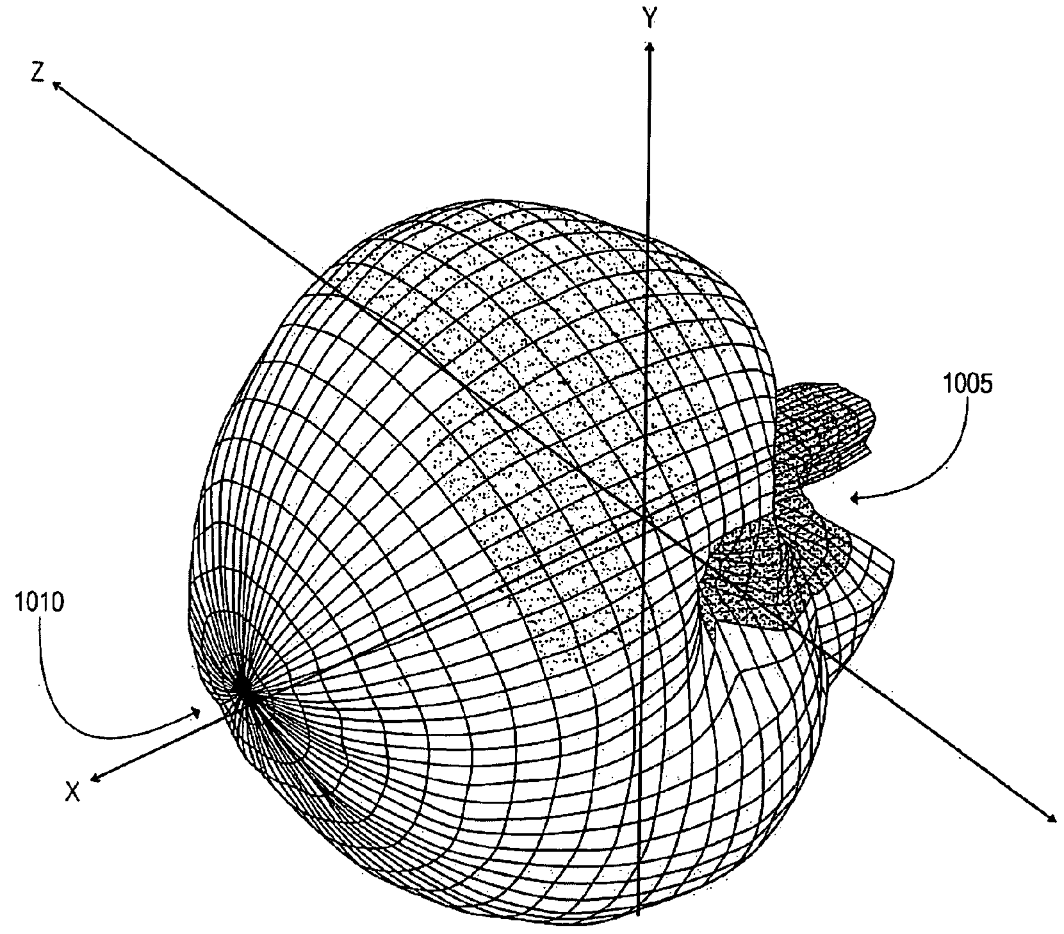
FIG. 10 illustrates a toroidal three dimensional, system level radiation pattern for the 850 MHz band, for the antenna used in FIG. 2.

Referring now to FIG. 10, a toroidal three dimensional radiated pattern characterizes the radiate power performance for the 850 MHz band. The pattern displays a hot spot 1010 and a null 1005 and represents the data points that are derived from the spatially distributed power measurements as described above. The null 1005 indicates that the wireless utility meter 100 does not radiate effectively in this region, however, the meter is behind the null. For this reason, the system performance is not affected. More importantly, the shaded region in the hot spot 1010 displays the effective level of radiated power that is radiated while in transmit mode. Further, the shaded region in the hot spot 1010 is equal to a power level of approximately 22 dBm or better. For this reason, antenna 210 provides a reliable level of performance, so that the wireless utility meter 100 meets or exceeds the CTIA total radiated power threshold. It will be understood in the art, that the wireless utility meter 100 would be overlaid on the x y z coordinate system of FIG. 10, as shown in FIG. 4.

Another embodiment of the invention optimizes the antenna 210 for the 1900 MHz band. By optimizing the antenna 210, as noted above, the wireless utility meter 100 meets the total radiated power and the total isotropic sensitivity thresholds for the 1900 MHz frequency band.

The total isotropic sensitivity is measured using a calibrated power measurement device in a controlled environment. It is calculated for 3 channels (low, middle and high) across each frequency band supported by the wireless utility meter 100 and is captured in both theta (horizontal) and phi (vertical) polarizations in angles, theta and phi (θ, ϕ). FIG. 5 shows the data points for channel 128 for phi and theta polarizations across the 850 MHz band. FIGS. 11 and 12 are tables showing additional effective isotropic sensitivity measurements captured at each angular interval (θ, ϕ) across the 850 MHz operating frequency band, for channels 128, 190, and 251 for theta and phi polarizations. Such data points, in addition to the data points 500 in FIG. 5, are utilized for calculating the total isotropic sensitivity.

Likewise, the total radiated power is measured using a calibrated power measurement device in a controlled environment. It is calculated for 3 channels (low, middle and high) across each frequency band supported by the wireless utility meter 100 and is captured in both theta (horizontal) and phi (vertical) polarizations in angles, theta and phi. FIGS. 8A through 8D show effective isotropic radiated power data points for channel 128 for theta and phi polarizations across the 850 MHz band. FIGS. 13A and 16B are tables showing additional effective isotropic radiated power data points, captured at each angular interval (θ, ϕ) across the 850 MHz operating frequency band, for channels 190 and 251 for theta and phi polarizations. Such data points, in addition to the data points 800 in FIG. 8A-D, are used for calculating the total radiated power.

While the invention has been described in terms of it embodiments, those skilled in the art will recognize that the invention can be practiced and implemented with modifications within the spirit and scope of the appended claims. This particular innovation may be implemented in other wireless applications. The present invention may also employ more than one antenna 210. For example, Wi-Fi applications may use two antennas. Variations using multiple antennas are well within the scope of the current invention.

Accordingly, it will be understood that various embodiments of the present invention described herein are preferably implemented as a special purpose or general-purpose computer including various computer hardware as discussed in greater detail below. Embodiments within the scope of the present invention also include computer-readable media for carrying or having computer-executable instructions or data structures stored thereon. Such computer-readable media can be any available media which can be accessed by a general purpose or special purpose computer, or downloadable to through wireless communication networks. By way of example, and not limitation, such computer-readable media can comprise physical storage media such as RAM, ROM, flash memory, EEPROM, CD-ROM, DVD, or other optical disk storage, magnetic disk storage or other magnetic storage devices, any type of removable non-volatile memories such as secure digital (SD), flash memory, memory stick etc., or any other medium which can be used to carry or store computer program code in the form of computer-executable instructions or data structures and which can be accessed by a general purpose or special purpose computer, or a mobile device.

When information is transferred or provided over a network or another communications connection (either hardwired, wireless, or a combination of hardwired or wireless) to a computer, the computer properly views the connection as a computer-readable medium. Thus, any such a connection is properly termed and considered a computer-readable medium. Combinations of the above should also be included within the scope of computer-readable media. Computer-executable instructions comprise, for example, instructions and data which cause a general purpose computer, special purpose computer, or special purpose processing device such as a mobile device processor to perform one specific function or a group of functions.

Those skilled in the art will understand the features and aspects of a suitable computing environment in which aspects of the invention may be implemented. Although not required, the inventions will be described in the general context of computer-executable instructions, such as program modules, being executed by computers in networked environments. Such program modules are often reflected and illustrated by flow charts, sequence diagrams, exemplary screen displays, and other techniques used by those skilled in the art to communicate how to make and use such computer program modules. Generally, program modules include routines, programs, objects, components, data structures, etc. that perform particular tasks or implement particular abstract data types, within the computer. Computer-executable instructions, associated data structures, and program modules represent examples of the program code for executing steps of the methods disclosed herein. The particular sequence of such executable instructions or associated data structures represent examples of corresponding acts for implementing the functions described in such steps.

Those skilled in the art will also appreciate that the invention may be practiced in network computing environments with many types of computer system configurations, including personal computers, hand-held devices, multi-processor systems, microprocessor-based or programmable consumer electronics, networked PCs, minicomputers, mainframe computers, and the like. The invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing the inventions, which is not illustrated, includes a general purpose computing device in the form of a conventional computer, including a processing unit, a system memory, and a system bus that couples various system components including the system memory to the processing unit. The computer will typically include one or more magnetic hard disk drives (also called "data stores" or "data storage" or other names) for reading from and writing to. The drives and their associated computer-readable media provide nonvolatile storage of computer-executable instructions, data structures, program modules, and other data for the computer. Although the exemplary environment described herein employs a magnetic hard disk, a removable magnetic disk, removable optical disks, other types of computer readable media for storing data can be used, including magnetic cassettes, flash memory cards, digital video disks (DVDs), Bernoulli cartridges, RAMs, ROMs, and the like.

Computer program code that implements most of the functionality described herein typically comprises one or more program modules may be stored on the hard disk or other storage medium. This program code, as is known to those skilled in the art, usually includes an operating system, one or more application programs, other program modules, and program data. A user may enter commands and information into the computer through keyboard, pointing device, or other input devices (not shown), such as a microphone, game pad, satellite dish, scanner, or the like. These and other input devices are often connected to the processing unit through known electrical, optical, or wireless connections.

The main computer that effects many aspects of the inventions will typically operate in a networked environment using logical connections to one or more remote computers or data sources, which are described further below. Remote computers may be another personal computer, a server, a router, a network PC, a peer device or other common network node, and typically include many or all of the elements described above relative to the main computer system in which the inventions are embodied. The logical connections between computers include a local area network (LAN), a wide area network (WAN), and wireless LANs (WLAN) that are presented here by way of example and not limitation. Such networking environments are commonplace in office-wide or enterprise-wide computer networks, intranets and the Internet.

When used in a LAN or WLAN networking environment, the main computer system implementing aspects of the invention is connected to the local network through a network interface or adapter. When used in a WAN or WLAN networking environment, the computer may include a modem, a wireless link, or other means for establishing communications over the wide area network, such as the Internet. In a networked environment, program modules depicted relative to the computer, or portions thereof, may be stored in a remote memory storage device. It will be appreciated that the network connections described or shown are exemplary and other means of establishing communications over wide area networks or the Internet may be used.

In view of the foregoing detailed description of preferred embodiments of the present invention, it readily will be understood by those persons skilled in the art that the present invention is susceptible to broad utility and application. While various aspects have been described in the context of a preferred embodiment, additional aspects, features, and methodologies of the present invention will be readily discernable therefrom. Many embodiments and adaptations of the present invention other than those herein described, as well as many variations, modifications, and equivalent arrangements and methodologies, will be apparent from or reasonably suggested by the present invention and the foregoing description thereof, without departing from the substance or scope of the present invention. Furthermore, any sequence(s) and/or temporal order of steps of various processes described and claimed herein are those considered to be the best mode contemplated for carrying out the present invention. It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in a variety of different sequences and orders, while still falling within the scope of the present inventions. In addition, some steps may be carried out simultaneously. Accordingly, while the present invention has been described herein in detail in relation to preferred embodiments, it is to be understood that this disclosure is only illustrative and exemplary of the present invention and is made merely for purposes of providing a full and enabling disclosure of the invention. The foregoing disclosure is not intended nor is to be construed to limit the present invention or otherwise to exclude any such other embodiments, adaptations, variations, modifications and equivalent arrangements, the present invention being limited only by the claims appended hereto and the equivalents thereof.

The invention claimed is:

1. A utility meter assembly comprising:

a plurality of meter components configured for measuring and collecting data, the plurality of meter components including a transceiver operative for signal communications over a network and a display of meter reading information;

a faceplate, mounted such that meter reading information from the display is displayed on the front of the faceplate;

a cylindrical exterior cover enclosing the faceplate and the meter components and including a closed end, the faceplate being disposed within the exterior cover a predetermined distance from the closed end so as to define a predetermined space between the faceplate and said closed end; and an internal dipole antenna with arcuate radiating elements disposed forward of the meter components within said predetermined space, the antenna comprising a center-fed driven element that supports a pair of elongate, metallic radiating elements, the arcuate radiating elements having a radius of curvature that is substantially similar to the radius of curvature of the cylindrical exterior cover such that the radiating elements conform to the interior curved shape of the cylindrical exterior cover, the center-fed driven element extending outwardly from the faceplate into said predetermined space and parallel to the axis of the cylindrical exterior cover toward the front of the utility meter assembly; and the dipole antenna having a length corresponding to the arcuate radiating elements, a width, and a thickness, the length being oriented such that the arcuate curvature is proximate to the interior curved shape of the cylindrical exterior cover, the width is oriented generally parallel with the axis of the cylindrical exterior cover, and the thickness is oriented generally aligned with a radius of the cylindrical exterior cover.

2. The utility meter assembly of claim 1, wherein the network is a wireless network.

3. The utility meter assembly of claim 1, wherein the internal dipole antenna is further situated away from the plurality of meter components, so as to minimize interference by the plurality of meter components.

4. The utility meter assembly of claim 1, wherein the faceplate is the front of an inner cover, the inner cover configured to enclose the plurality of meter components.

5. The utility meter assembly of claim 1, wherein the faceplate is extended from a metering information component.

6. The utility meter assembly of claim 5, wherein the metering information component is an LCD board.

7. The utility meter assembly of claim 1, further comprising a connection point on the faceplate for securing the internal dipole antenna to the faceplate.

8. The utility meter assembly of claim 1, wherein the internal dipole antenna is attached to meter components behind the faceplate for securing the antenna.

9. The utility meter assembly of claim 1, wherein the internal dipole antenna is 5.2 inches in length and 0.9 inches in width.

10. The utility meter assembly of claim 9, wherein the center-fed driven element is 0.5 inches in length and 0.725 inches in width.

11. The utility meter assembly of claim 1, wherein the internal dipole antenna is concealed by a coversheet material, the coversheet material configured for providing environmental protection and electrical insulation, and wherein the thickness of the antenna comprises the thickness of the coversheet material.

12. The utility meter assembly of claim 11, wherein the coversheet material has a total finish thickness of 0.0178 inches.

13. The utility meter assembly of claim 1, wherein the utility meter assembly is configured for measuring and collecting data related to at least one of: electrical power, natural gas, water.

14. The utility meter assembly of claim 1, wherein the internal dipole antenna is tuned for optimal matching impedance in an 850 MHz receive band, wherein a desired receive band Standing Wave Ratio (SWR) is achieved, and wherein a specified minimum radiated power threshold is maintained.

15. The utility meter assembly of claim 1, wherein the internal dipole antenna is tuned for optimal matching impedance in a 1900 MHz receive band, wherein a desired receive band Standing Wave Ratio (SWR) is achieved, and wherein a specified minimum radiated power threshold is maintained.

16. A utility meter assembly comprising:

an exterior cover including an open end for receiving and enclosing a plurality of meter components of the utility meter assembly and a closed end, the closed end defining an inner surface and an outer surface;

the plurality of meter components housed within the exterior cover and operative for measuring and collecting data, the plurality of meter components including a transceiver operative for signal communications over a network and a metering information component;

a faceplate providing a surface for the metering information component and disposed a predetermined distance from the inner surface of the exterior cover, thereby defining a space between the inner surface of the exterior cover of the utility meter assembly and the faceplate; and an internal dipole antenna comprising a center-fed driven element that supports a pair of oppositely disposed, elongate, metallic, radiating elements deformed into a shape that conforms to the internal shape of the exterior cover and positioned such that the radiating elements extend into the space defined between the inner surface of the exterior cover of the utility meter assembly and forward of the surface of the faceplate, the radiating elements of the dipole antenna being operatively coupled to the transceiver, the dipole antenna having a length corresponding to the radiating elements, a width, and a thickness, the length being oriented such that the radiating elements are proximate to the interior shape of the exterior cover, the width is oriented generally parallel with the axis of the exterior cover, and the thickness is oriented generally aligned with a radius of the exterior cover.

17. The utility meter assembly of claim 16, wherein the faceplate is the front of an inner cover, the inner cover configured to enclose the plurality of meter components.

18. The utility meter assembly of claim 16, wherein the meter components include a metering information component.

19. The utility meter assembly of claim 18, wherein the faceplate is substantially coplanar with the metering information component.

20. The utility meter assembly of claim 18, wherein the metering information component is an LCD board.

21. The utility meter assembly of claim 16, further comprising a connection point on the faceplate for securing the internal dipole antenna to the faceplate.

22. The utility meter assembly of claim 16, wherein the exterior cover is cylindrical.

23. The utility meter assembly of claim 22, wherein the internal dipole antenna is conformed to a curved shape of the cylindrical exterior cover.

24. The utility meter assembly of claim 16, wherein the internal dipole antenna is 5.2 inches in length and 0.9 inches in width.

25. The utility meter assembly of claim 24, wherein the center-fed driven element is 0.5 inches in length and 0.725 inches in width.

26. The utility meter assembly of claim 16, wherein the internal dipole antenna is concealed by a coversheet material, the coversheet material configured for providing environmental protection and electrical insulation, and wherein the thickness of the antenna comprises the thickness of the coversheet material.

27. The utility meter assembly of claim 26, wherein the coversheet material has a total finish thickness of 0.0178 inches.

28. The utility meter assembly of claim 16, wherein the utility meter assembly is configured for measuring and collecting data related to at least one of:

electrical power, natural gas, water.

29. The utility meter assembly of claim 16, wherein the internal dipole antenna is tuned for optimal matching impedance in an 850 MHz receive band, wherein a desired receive band Standing Wave Ratio (SWR) is achieved, and wherein a specified minimum radiated power threshold is maintained.

30. The utility meter assembly of claim 16, wherein the internal dipole antenna is tuned for optimal matching impedance in a 1900 MHz receive band, wherein a desired receive band Standing Wave Ratio (SWR) is achieved, and wherein a specified minimum radiated power threshold is maintained.

31. The utility meter assembly of claim 16, further comprising a secondary cover that encloses the faceplate and the plurality of meter components and wherein the dipole antenna is mounted on the secondary cover.

* * * * *